United States Patent
Shin et al.

(10) Patent No.: US 12,364,065 B2
(45) Date of Patent: Jul. 15, 2025

(54) DISPLAY APPARATUS USING SEMICONDUCTOR LIGHT-EMITTING DEVICE, AND MANUFACTURING METHOD THEREFOR

(71) Applicants: LG ELECTRONICS INC., Seoul (KR); LG DISPLAY CO., LTD., Seoul (KR)

(72) Inventors: Junoh Shin, Seoul (KR); Jeonghyo Kwon, Seoul (KR)

(73) Assignees: LG ELECTRONICS INC., Seoul (KR); LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/691,668

(22) PCT Filed: Sep. 14, 2021

(86) PCT No.: PCT/KR2021/012459
§ 371 (c)(1),
(2) Date: Mar. 13, 2024

(87) PCT Pub. No.: WO2023/042924
PCT Pub. Date: Mar. 23, 2023

(65) Prior Publication Data
US 2024/0266472 A1    Aug. 8, 2024

(51) Int. Cl.
*H10H 20/831* (2025.01)
*H01L 25/075* (2006.01)
(Continued)

(52) U.S. Cl.
CPC ..... *H10H 20/8312* (2025.01); *H01L 25/0753* (2013.01); *H10H 20/815* (2025.01); *H10H 20/819* (2025.01); *H10H 20/857* (2025.01)

(58) Field of Classification Search
CPC ............ H10H 20/8312; H10H 20/815; H10H 20/819; H10H 20/857; H10H 29/142; H10H 20/84; H01L 25/0753
See application file for complete search history.

(56) References Cited

U.S. PATENT DOCUMENTS 9,419,223 B2 *    8/2016   Kang ................... H10K 59/122
2002/0158835 A1 *  10/2002  Kobayashi ....... H10K 59/80522
                                                          345/100
(Continued)

FOREIGN PATENT DOCUMENTS

CN        111684601 A       9/2020
JP        2013-109907 A     6/2013
(Continued)

OTHER PUBLICATIONS

International Search Report, issued in PCT/KR2021/012459, PCT/ISA/210, dated Jun. 8, 2022.

*Primary Examiner* — Su C Kim
(74) *Attorney, Agent, or Firm* — Birch, Stewart, Kolasch & Birch, LLP

(57) ABSTRACT

The present invention is applicable to display device-related technical fields and, for example, relates to a display device using micro LED (Light Emitting Diode) and a method of manufacturing the same. The present invention includes a substrate including a pixel area and a pad area located around the pixel area; a barrier layer located on the substrate and defining a plurality of unit pixel areas within the pixel area; a stress separation line located between the unit pixel areas on the barrier layer; a first electrode located in the unit pixel area; a semiconductor light emitting device in which a first type electrode is electrically connected to the first electrode within the unit pixel area; a coating layer formed on the semiconductor light emitting device and the barrier (Continued)

layer; and a second electrode electrically connected to the type second electrode of the semiconductor light emitting device on the coating layer.

15 Claims, 24 Drawing Sheets

(51) Int. Cl.
    *H10H 20/815*     (2025.01)
    *H10H 20/819*     (2025.01)
    *H10H 20/857*     (2025.01)

(56) References Cited

U.S. PATENT DOCUMENTS

| | | |
|---|---|---|
| 2013/0169515 A1 | 7/2013 | Prushinskiy et al. |
| 2014/0159064 A1* | 6/2014 | Sakariya ............... H01L 25/167 |
| | | 257/88 |
| 2014/0209947 A1* | 7/2014 | Cho ................... H01L 25/0753 |
| | | 257/98 |
| 2020/0152720 A1 | 5/2020 | Zhang |
| 2020/0365567 A1 | 11/2020 | Park et al. |
| 2021/0167044 A1 | 6/2021 | Kiridoshi |
| 2021/0202451 A1 | 7/2021 | Kong et al. |
| 2021/0336203 A1 | 10/2021 | Sun et al. |
| 2023/0005886 A1 | 1/2023 | Kang et al. |
| 2023/0110862 A1 | 4/2023 | Kim et al. |

FOREIGN PATENT DOCUMENTS

| | | |
|---|---|---|
| KR | 10-1788317 B1 | 11/2017 |
| KR | 10-2017-0135651 A | 12/2017 |
| KR | 10-2020-0021574 A | 3/2020 |
| KR | 10-2020-0026770 A | 3/2020 |
| KR | 10-2020-0026845 A | 3/2020 |
| KR | 10-2021-0038509 A | 4/2021 |
| WO | WO2020/073226 A1 | 4/2020 |

* cited by examiner

[FIG. 1]
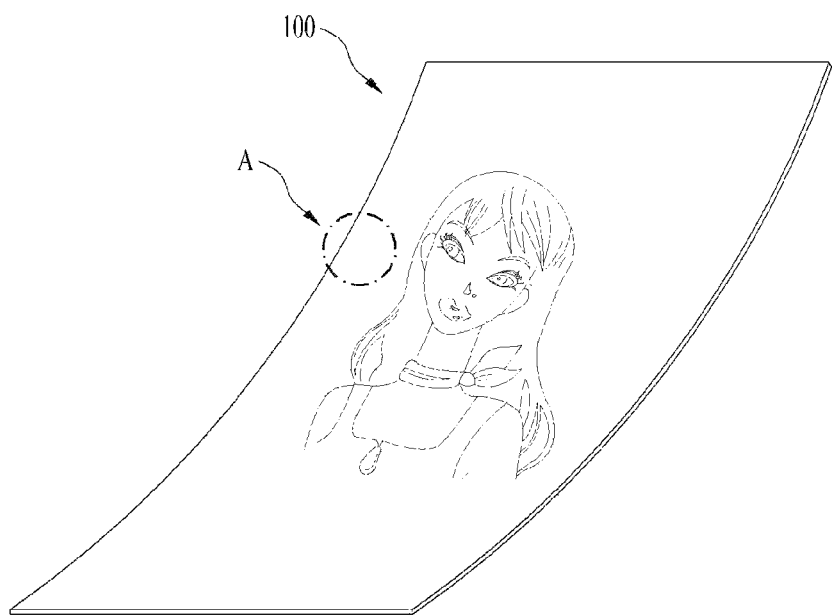

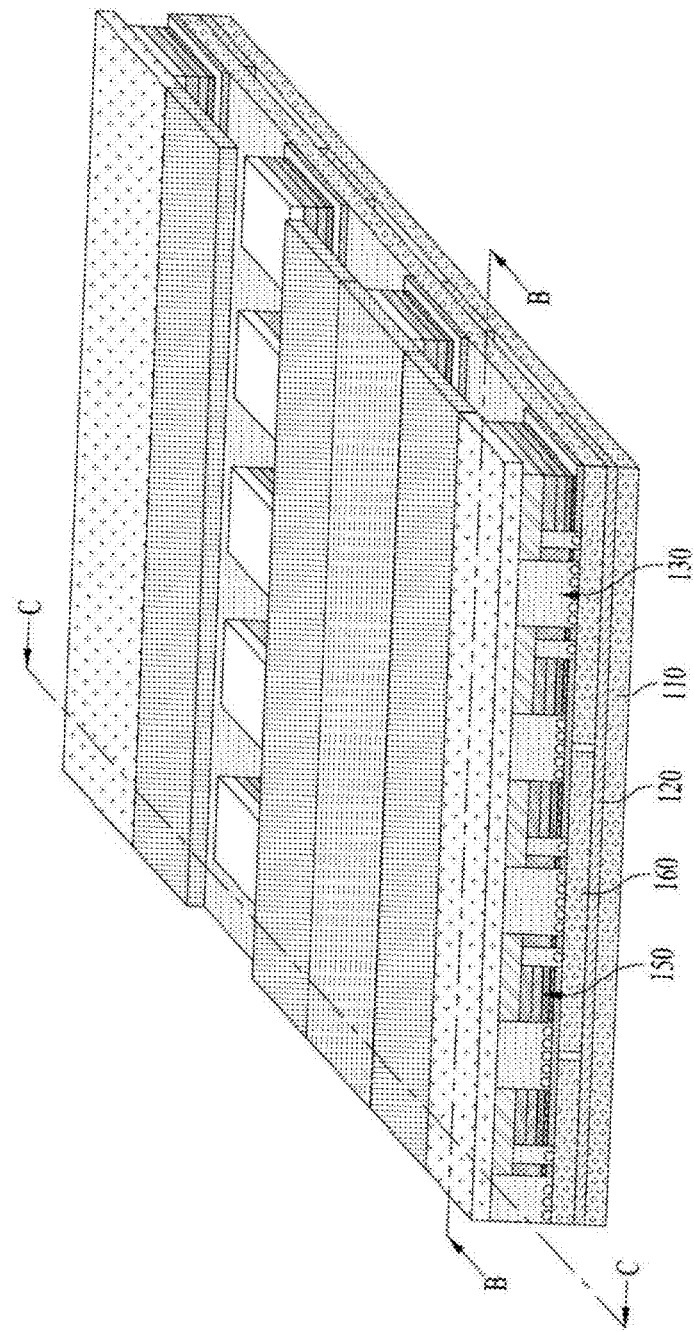
[FIG. 2]

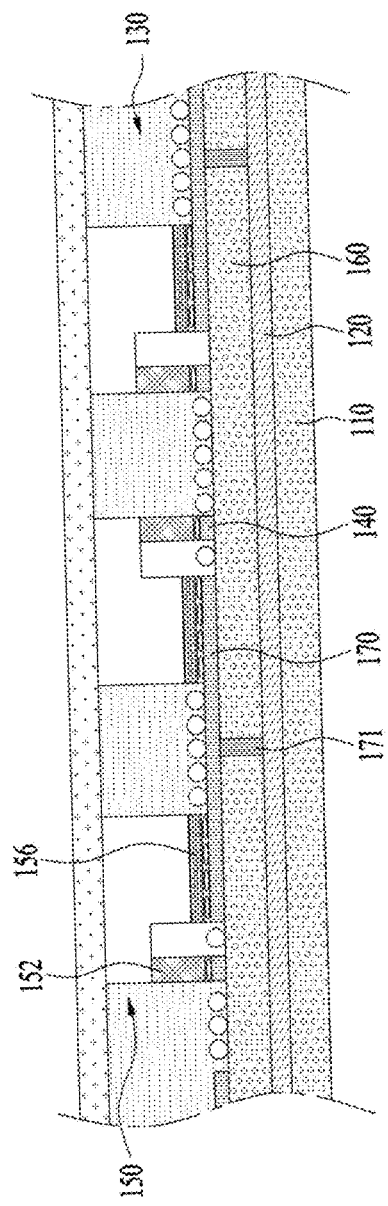
[FIG. 3a]

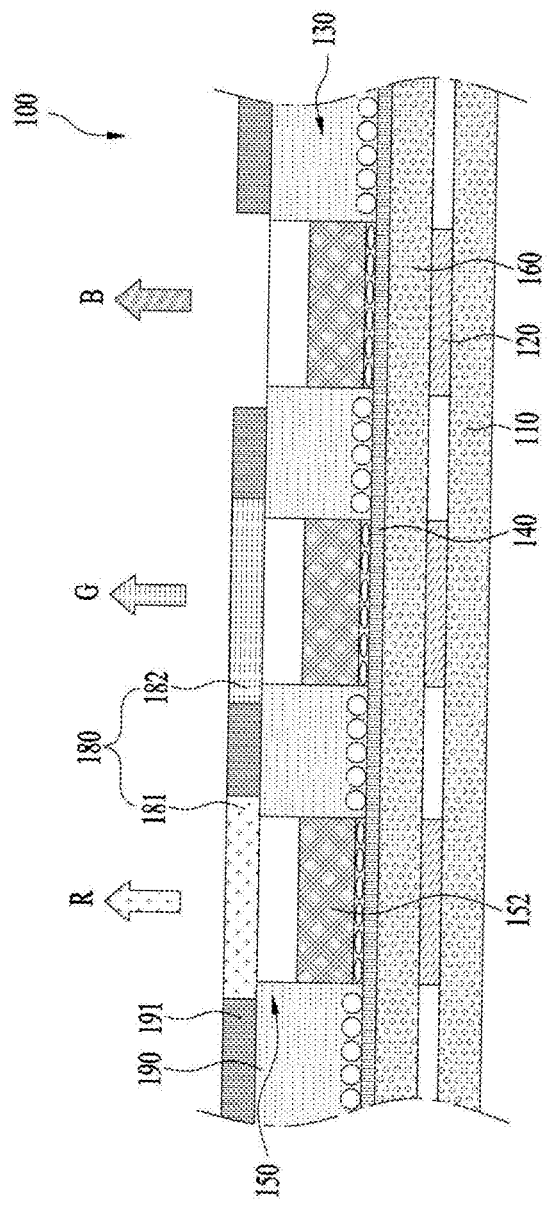
[FIG. 3b]

[FIG. 4]
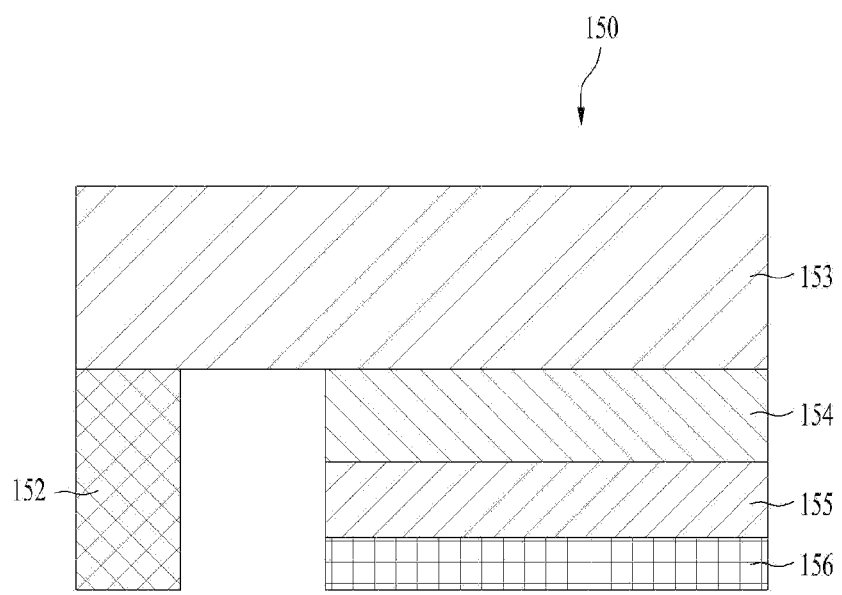

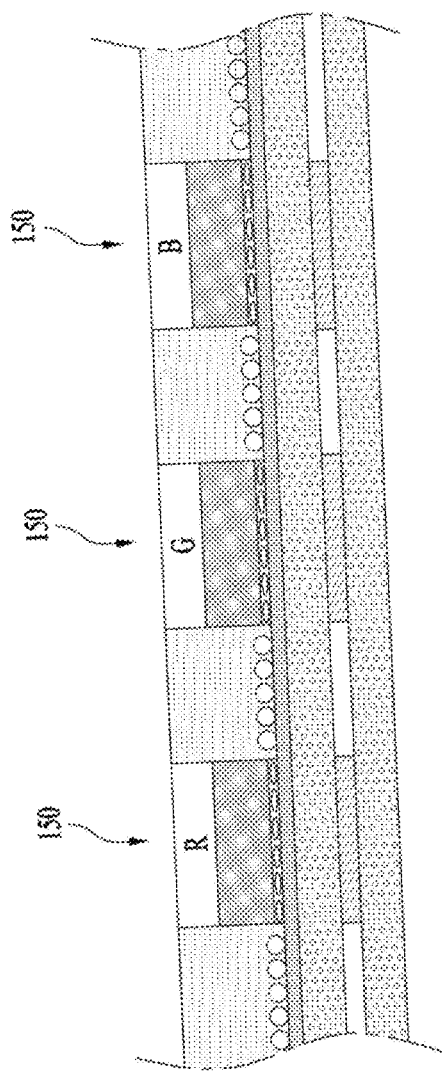
[FIG. 5a]

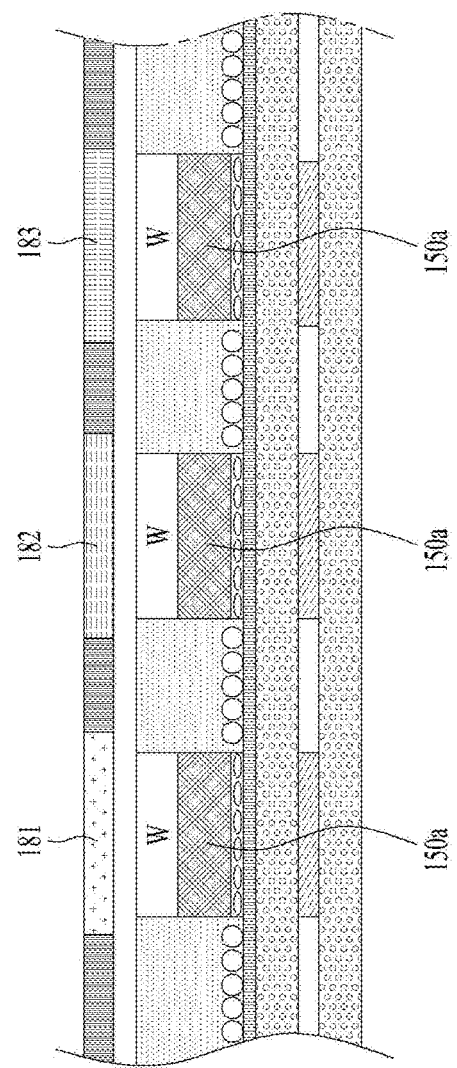
[FIG. 5b]

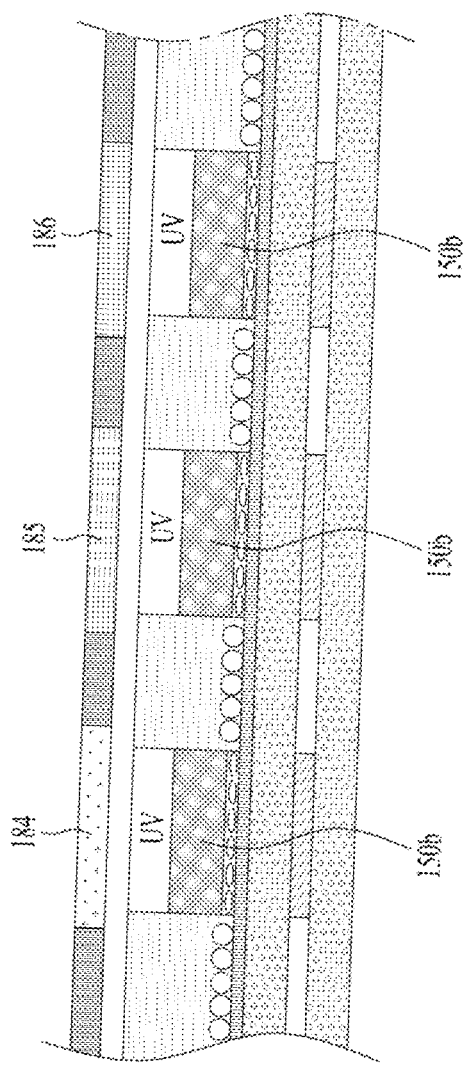
[FIG. 5c]

[FIG. 6]
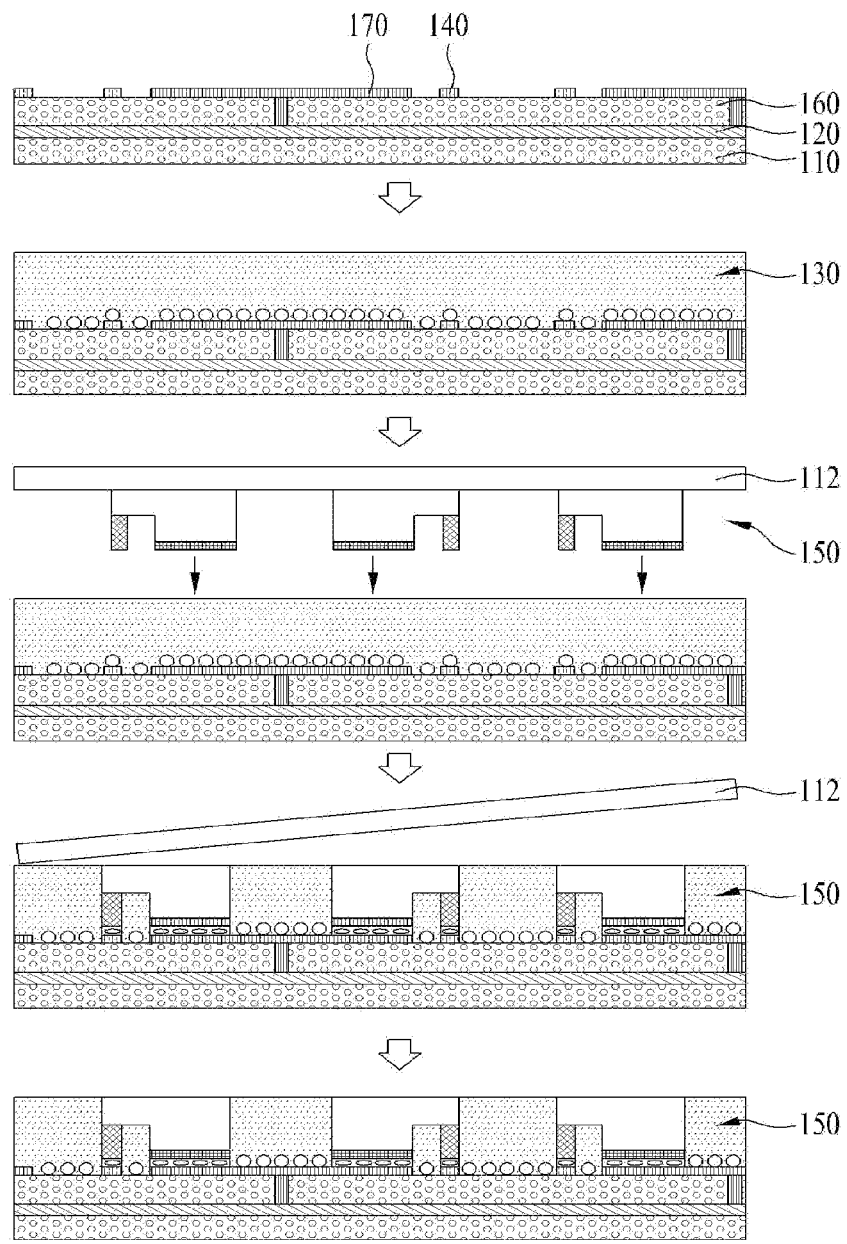

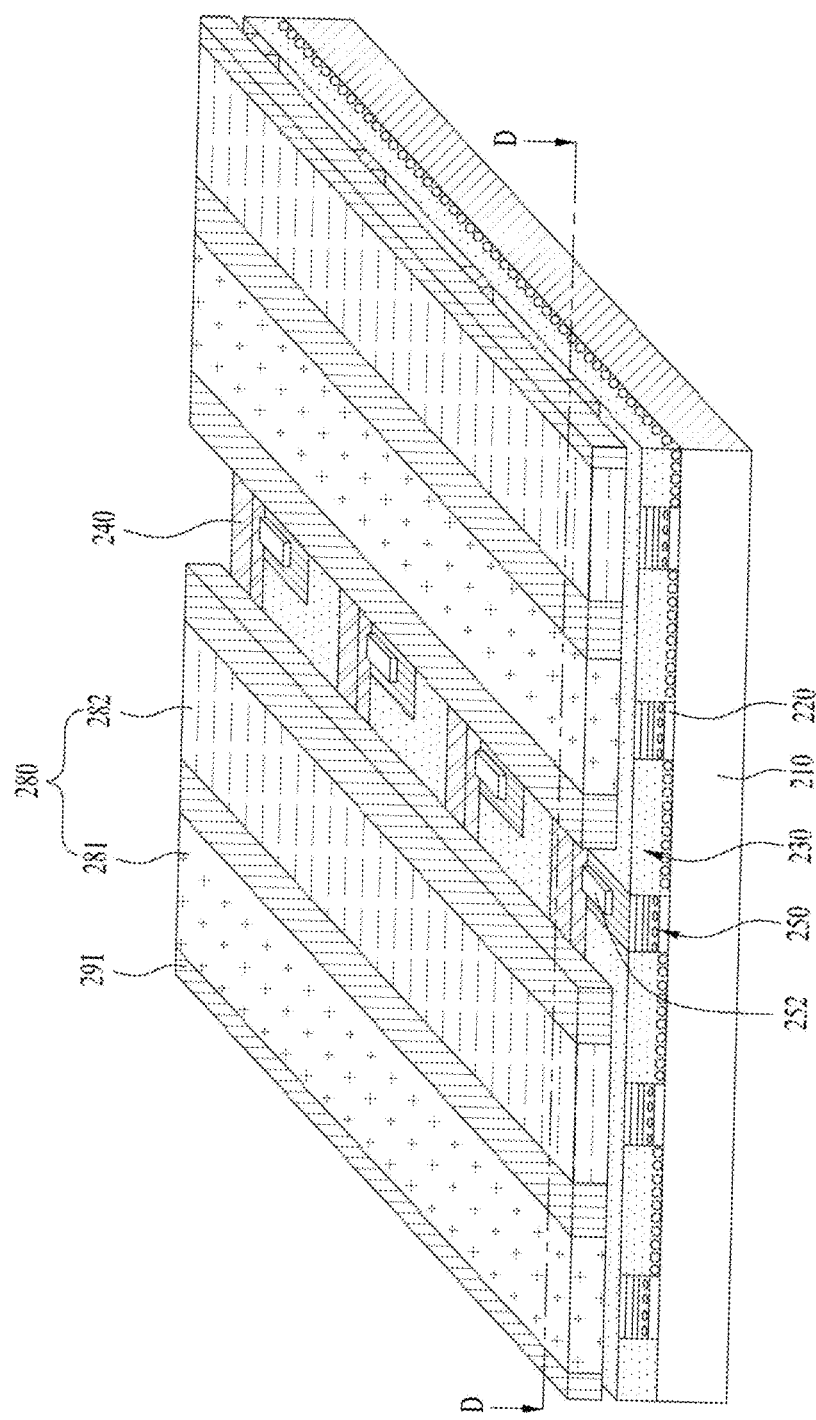
[FIG. 7]

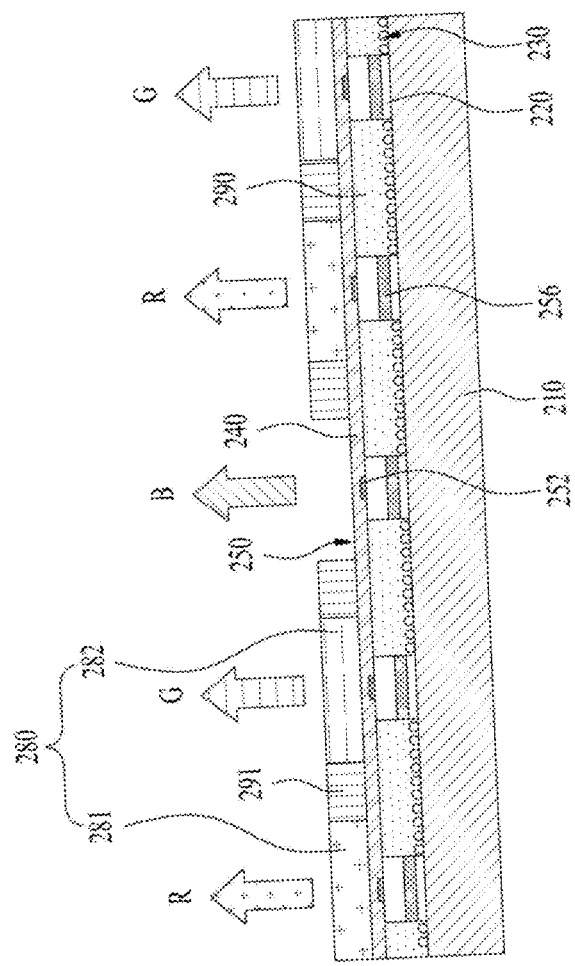
[FIG. 8]

[FIG. 9]
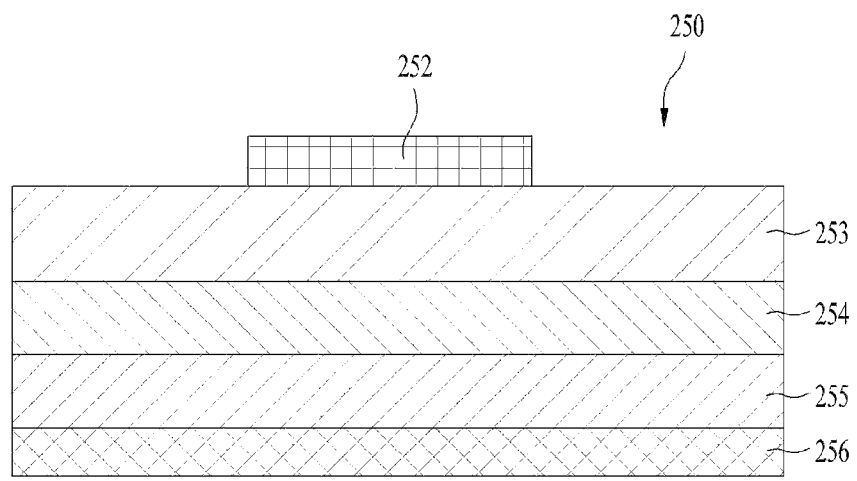

[FIG. 10]
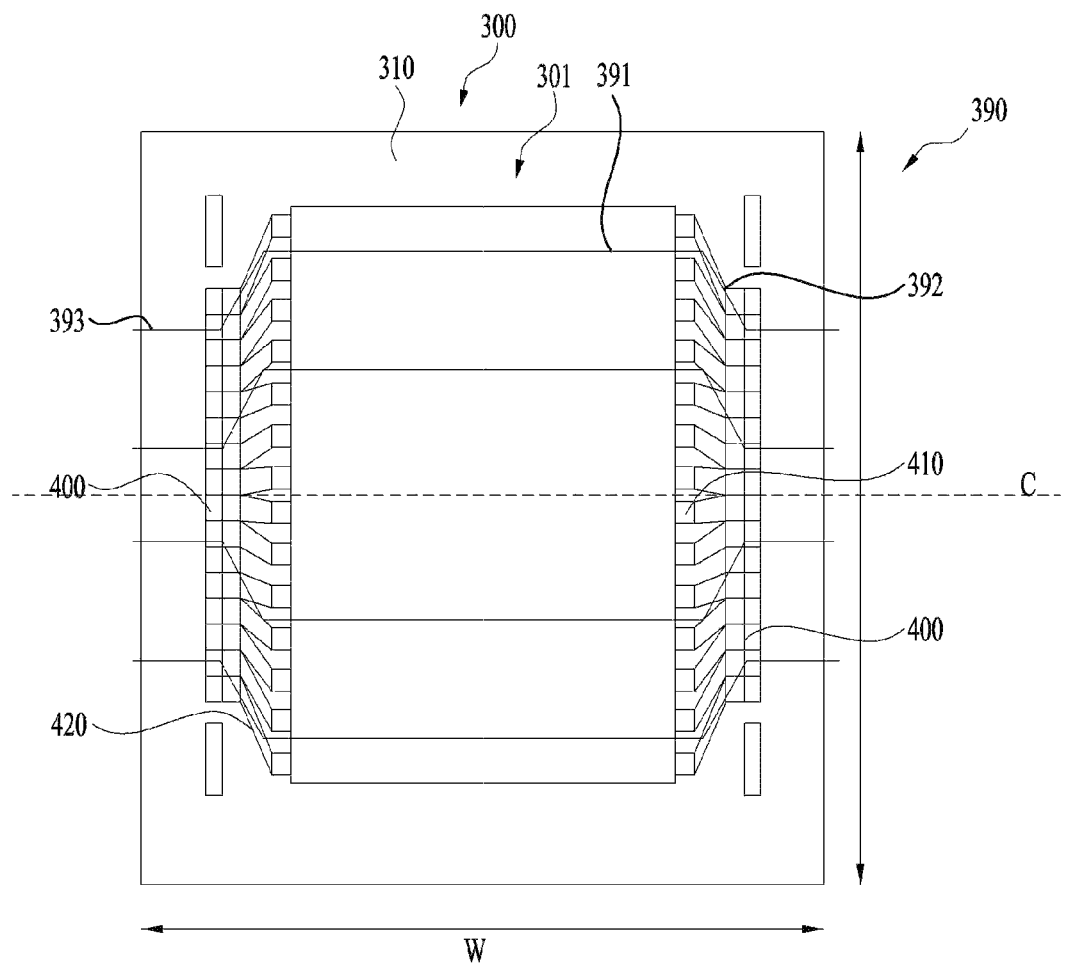

[FIG. 11]
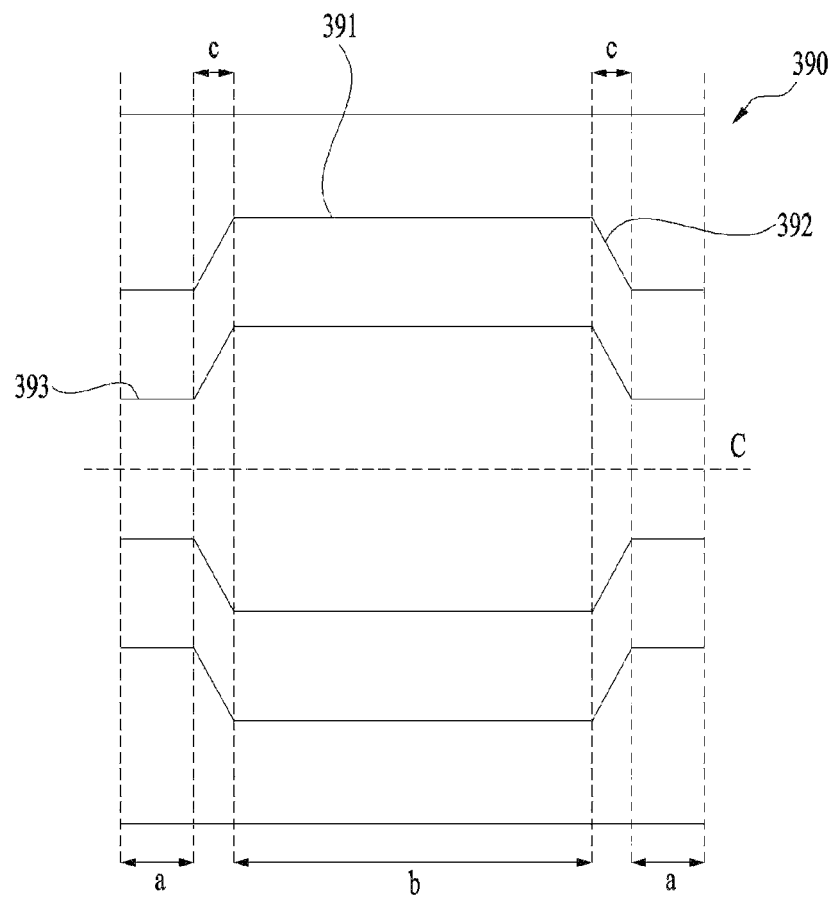

[FIG. 12]
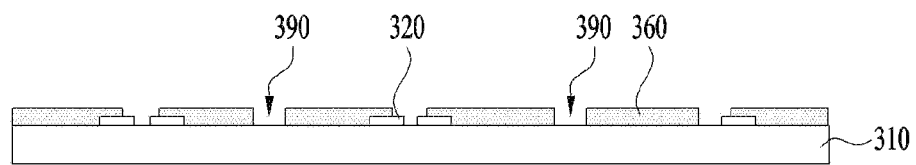
[FIG. 13]
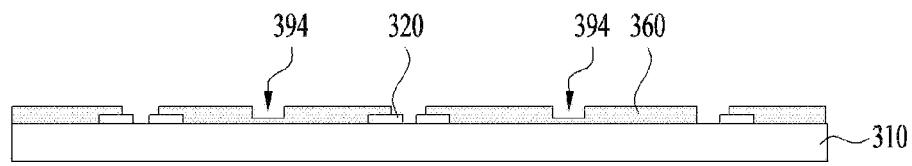
[FIG. 14]
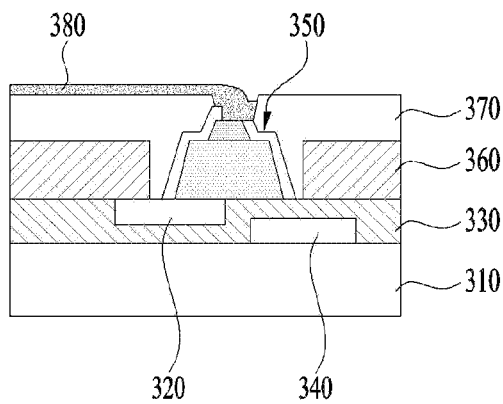

[FIG. 15]
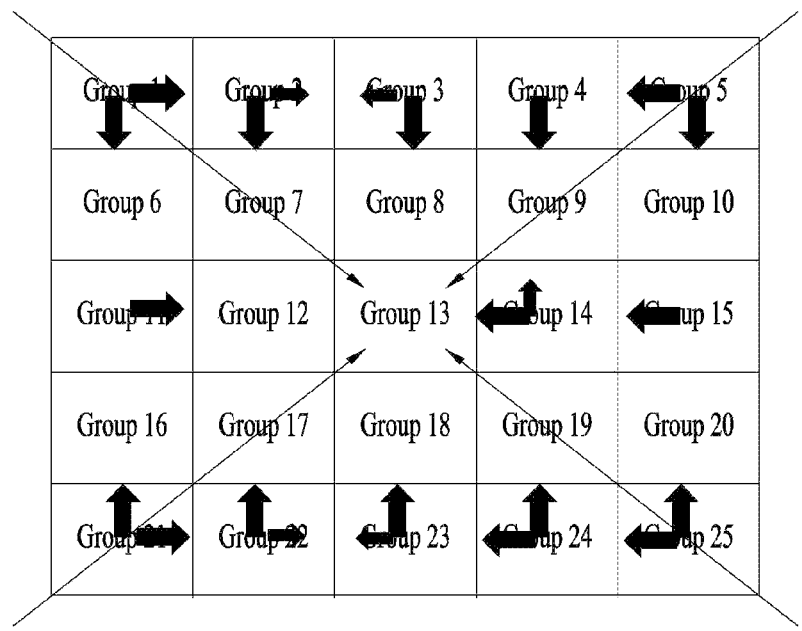
[FIG. 16]
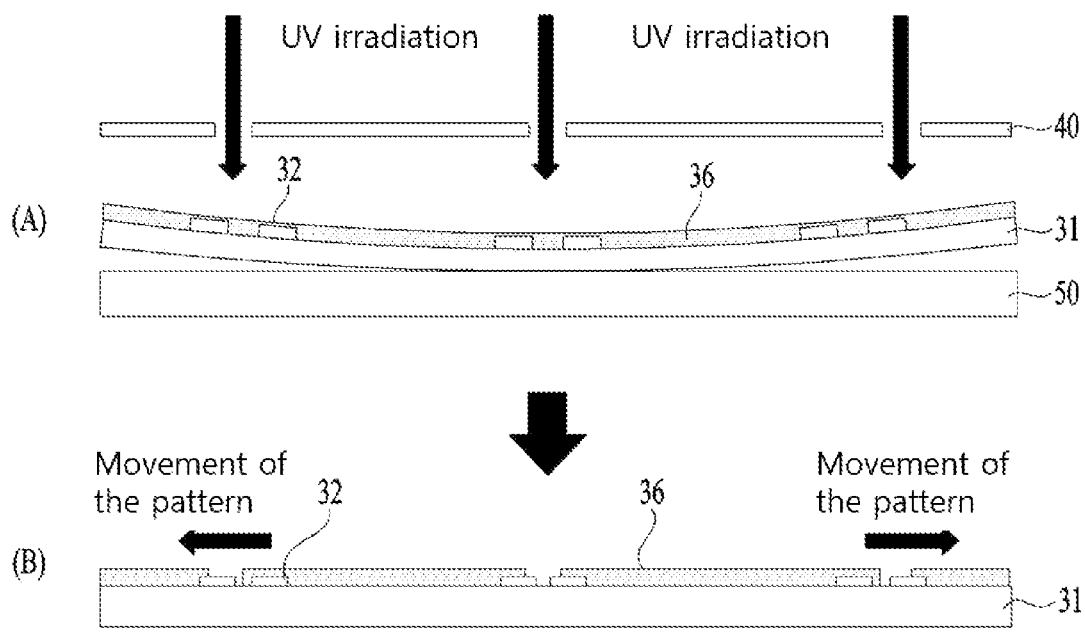

[FIG. 17]
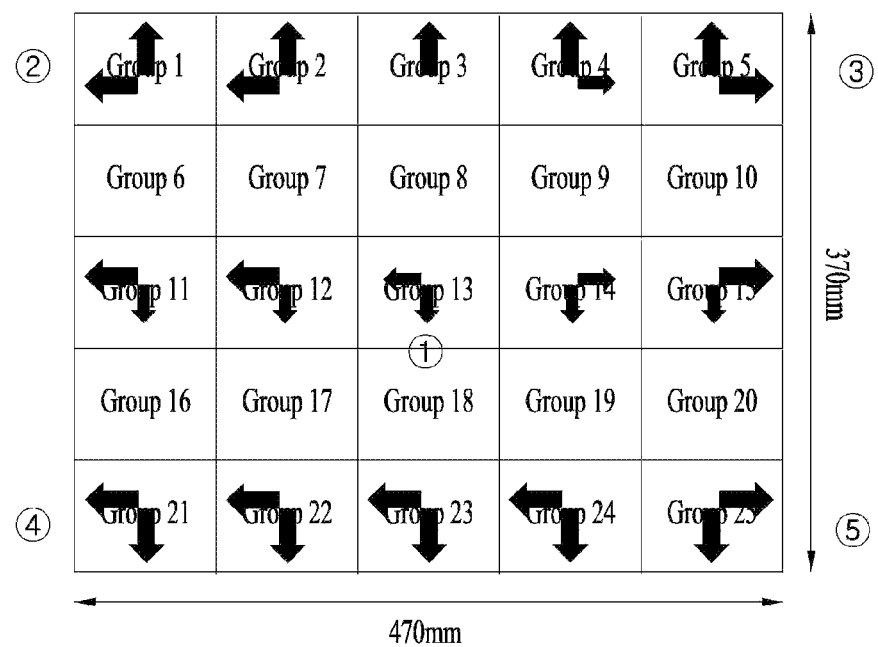

[FIG. 18]
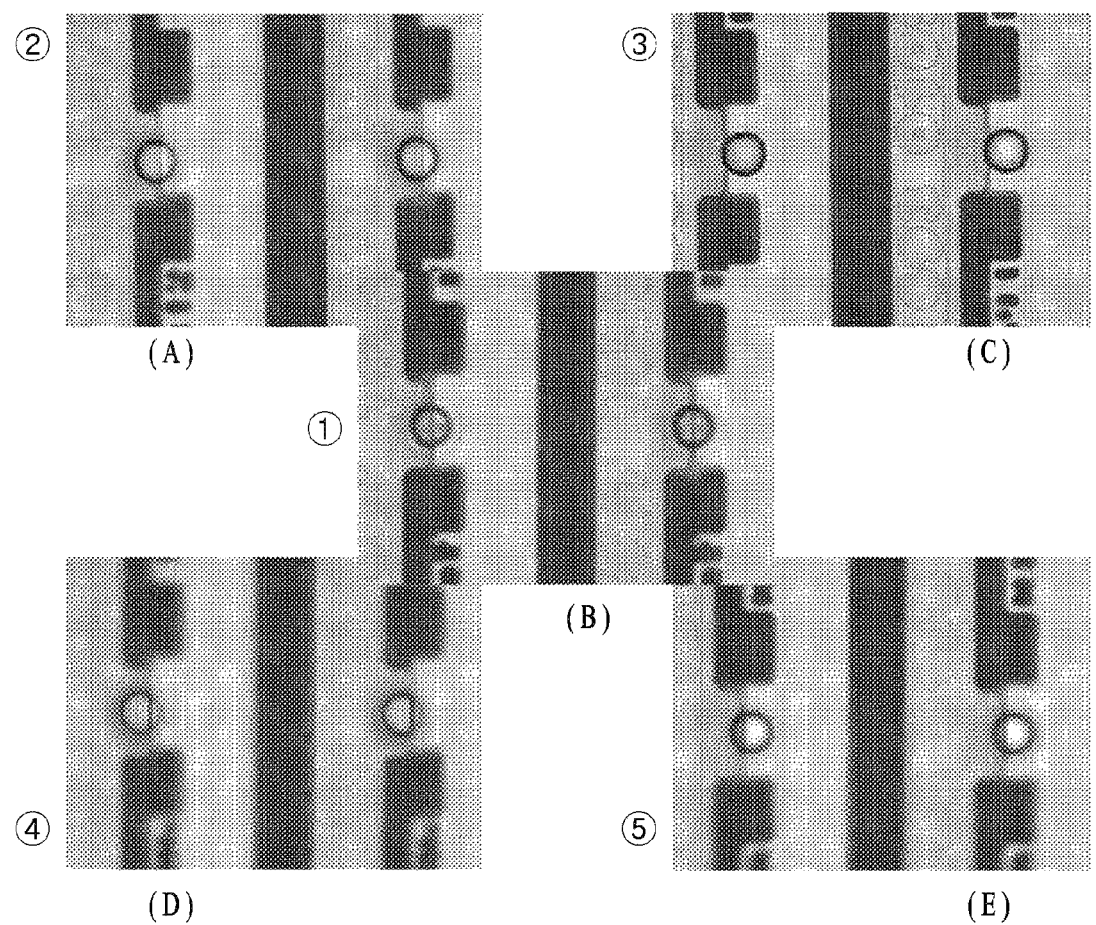

[FIG. 19]
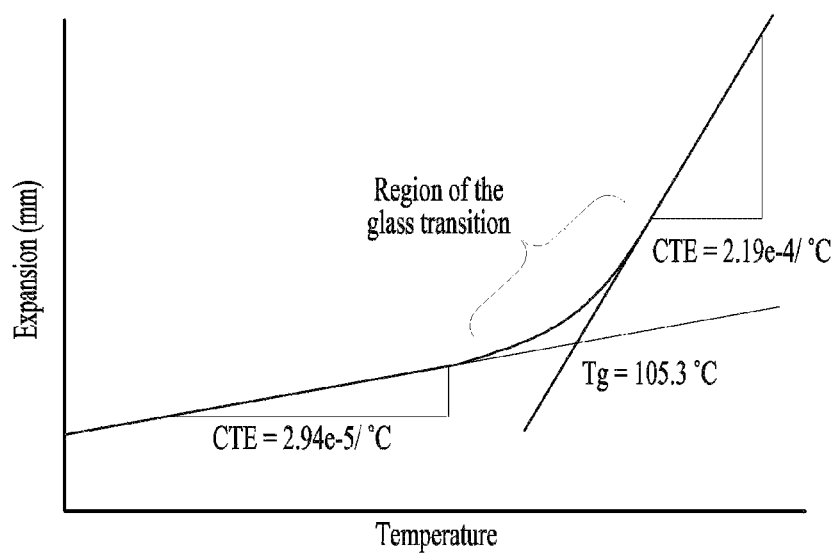

[FIG. 20]
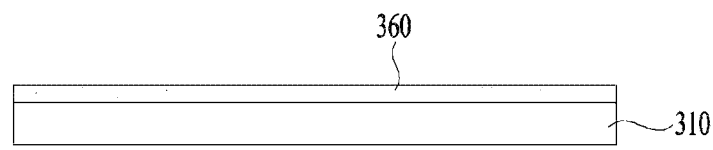
(A)
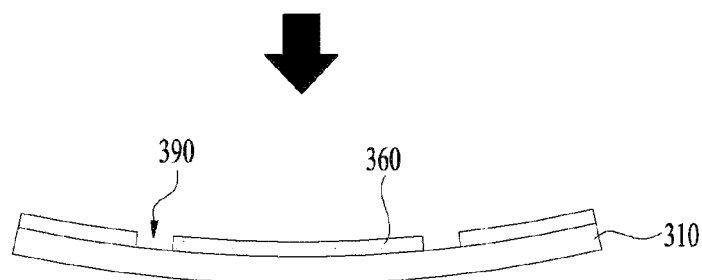
(B)
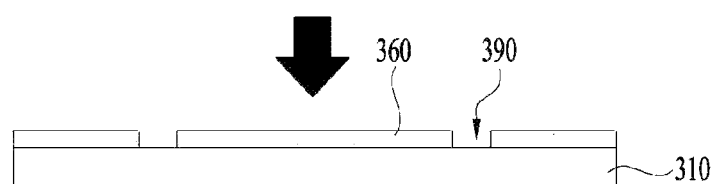
(C)

[FIG. 21]
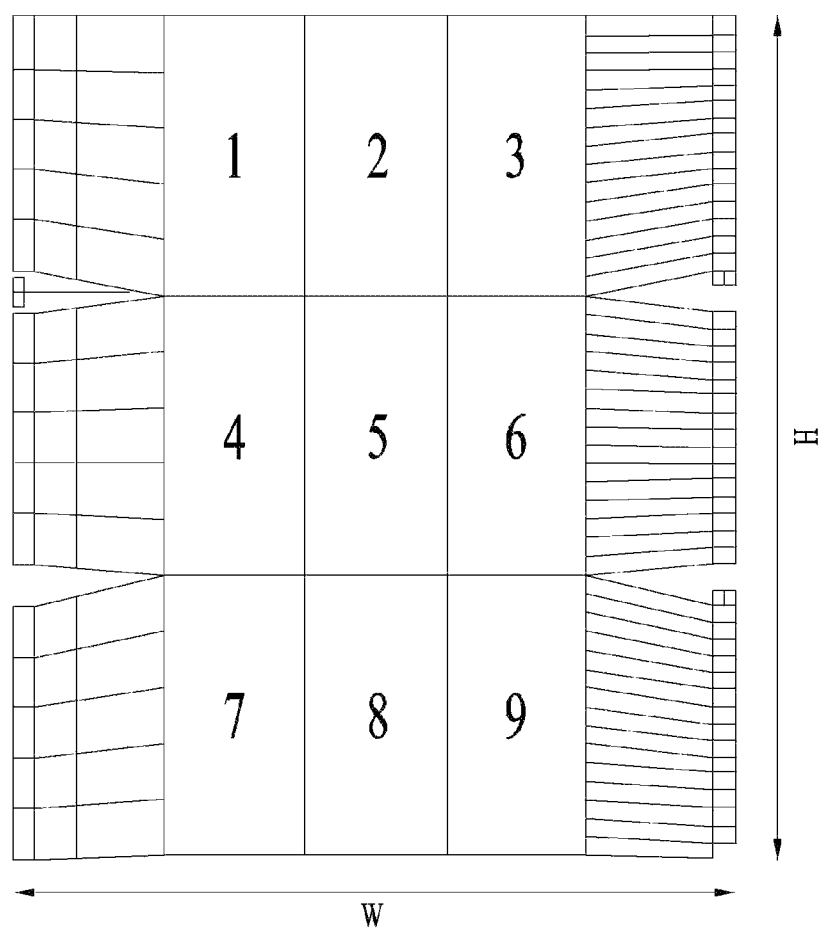

[FIG. 22]
①
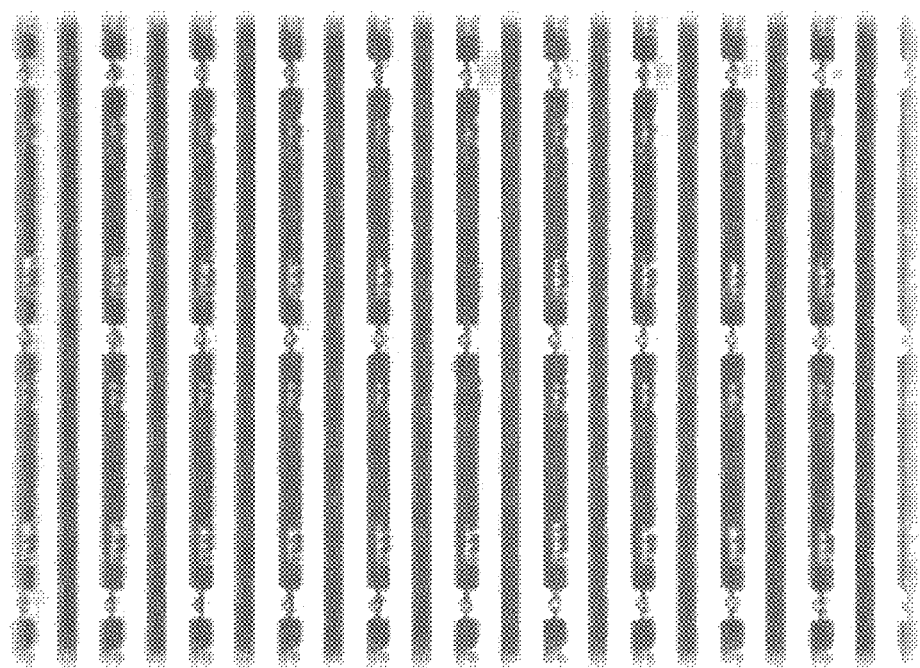

[FIG. 23]
⑤
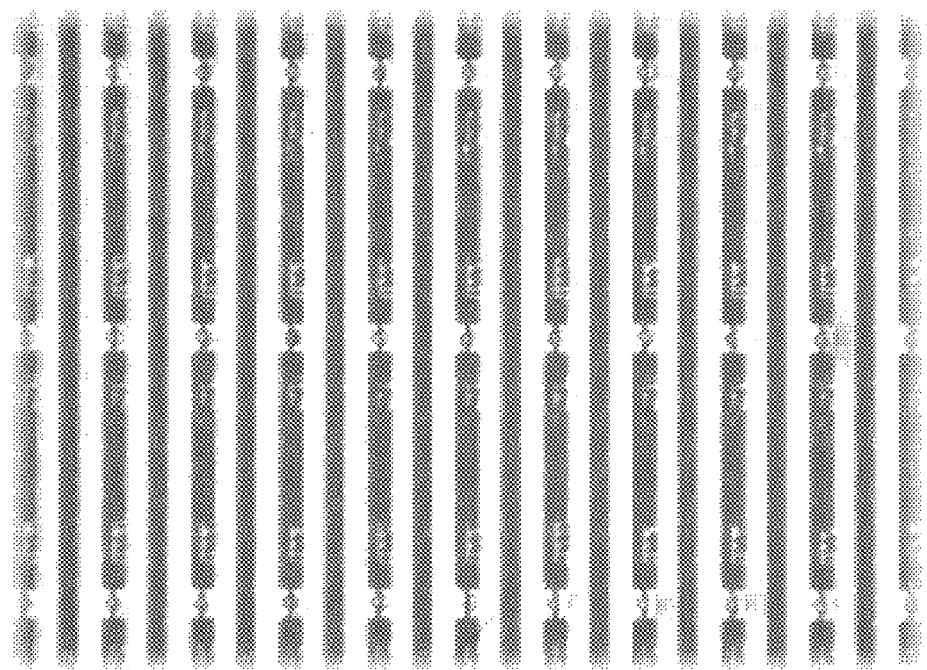

[FIG. 24]
⑨
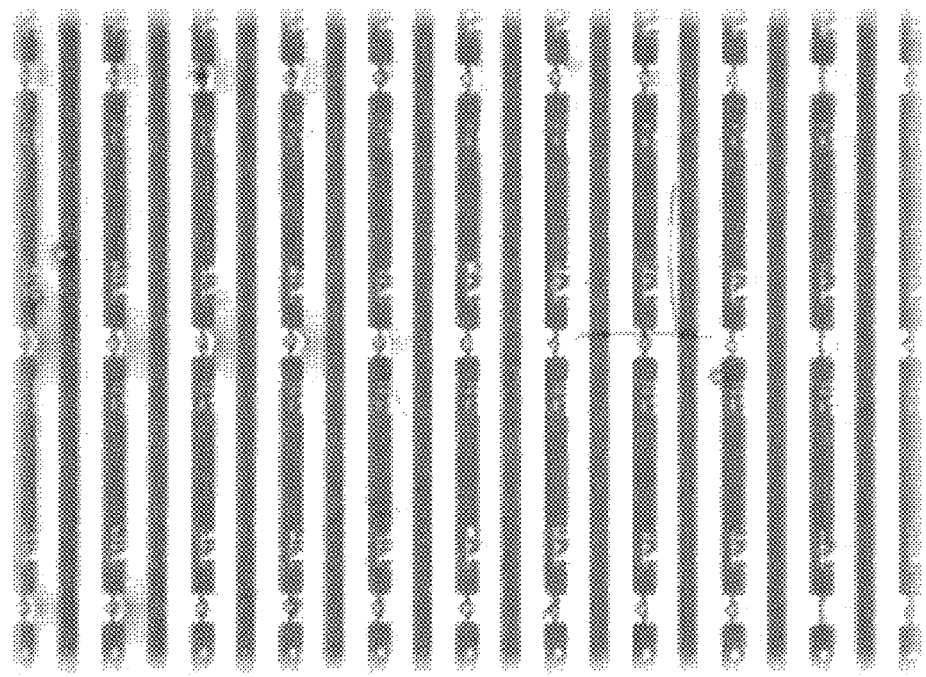

DISPLAY APPARATUS USING SEMICONDUCTOR LIGHT-EMITTING DEVICE, AND MANUFACTURING METHOD THEREFOR

CROSS REFERENCE TO RELATED APPLICATIONS

This application is the National Phase of PCT/KR2021/012459 filed on Sep. 14, 2021, which is hereby expressly incorporated by reference into the present application.

TECHNICAL FIELD

The present invention is applicable to display device-related technical fields and, for example, relates to a display device using micro LED (Light Emitting Diode) and a method of manufacturing the same.

BACKGROUND ART

Recently, in the field of display technology, display devices with excellent characteristics such as thinness and flexibility have been developed. In contrast, currently commercialized major displays are represented by LCD (Liquid Crystal Display) and OLED (Organic Light Emitting Diodes).

Meanwhile, Light Emitting Diode (LED) is a well-known semiconductor light emitting device that converts electric current into light, starting with the commercialization of red LEDs using GaAsP compound semiconductors in 1962, the semiconductor light emitting device have been used as light sources for display images in electronic devices, including information and communication devices, along with green LEDs of the GaP:N series.

Recently, these light emitting diodes (LEDs) have been gradually miniaturized and manufactured into micrometer-sized LEDs, which are used as pixels in display devices.

This type of micro LED technology exhibits characteristics of low power, high brightness, and high reliability compared to other display devices/panels, and may also be applied to flexible devices. Therefore, it has been actively studied in recent years by research institutes and companies.

A recent issue related to micro LED is the technology to transfer LED to the panel. To make one display device using micro LED, many LEDs are used, but attaching them one by one is a very difficult and time-consuming task.

Meanwhile, when assembling micro LEDs, there may be cases where the micro LEDs are assembled deviated from the position of the unit device area.

The location of the assembly hole where the micro LED is transferred may be defined by the barrier layer. To this end, a barrier layer may be formed on the substrate, an assembly hole may be formed, and then a curing process for the barrier layer may be performed. This curing process may usually include a thermal or ultraviolet curing process. Since this transition process is a high temperature process, the barrier layer may expand. Accordingly, the mounting space (assembly hole pattern) formed at the location where the light emitting device is to be mounted may be moved.

Therefore, depending on the location of the display device, a phenomenon may occur where the pattern indicating the mounting position formed on the barrier layer and the unit pixel area defined by the actual electrode are misaligned. In other words, there may be a mismatch between the pattern of the unit pixel area defined by the electrode and the pixel area formed on the barrier layer.

Likewise, in the panel process of a display device, when forming a barrier layer after forming a metal wiring electrode for mounting a light emitting device (chip transfer), patterning errors in wiring and assembly holes may occur at outer locations due to substrate bending.

The degree of this patterning error may increase as it moves further to the outskirts compared to the central area of the display device.

Such patterning errors may cause deviations in the brightness of the micro LED, or in some cases, the micro LED may not light up.

Therefore, a solution to problems that arise when producing displays using these micro LEDs is required.

DISCLOSURE

Technical Problem

The technical problem to be solved by the present invention is to provide a display device using a semiconductor light emitting device and a manufacturing method thereof that may minimize alignment tolerances that may occur in the panel process.

The technical object is to provide a display device using a semiconductor light emitting device and a manufacturing method thereof that may prevent bending in the structure where the substrate and barrier layer are formed during the panel process or changing the position of the assembly hole formed in the unit pixel area.

In addition, the technical object is to provide a display device using a semiconductor light emitting device and a manufacturing method thereof that may effectively block stress acting in a radial direction from the center of the substrate during the panel process.

In addition, the technical object is to provide a display device using a semiconductor light emitting device and a manufacturing method thereof that may effectively block stress that may occur during thermal curing or cooling of the barrier layer during the panel process.

In addition, the technical object is to provide a display device using a semiconductor light emitting device and a manufacturing method thereof that may reduce the number of processes connecting the semiconductor light emitting device and the upper wiring.

In addition, the technical object is to provide a device that may secure the maximum contact area between the semiconductor light emitting device chip electrode and the second electrode (upper wiring, lighting electrode) by minimizing alignment errors in the post-panel process.

Technical Solution

As a first aspect to achieve the above object, the present invention may include a substrate including a pixel area and a pad area located around the pixel area, a barrier layer located on the substrate and defining a plurality of unit pixel areas within the pixel area, a stress separation line located between the unit pixel areas on the barrier layer, a first electrode located in the unit pixel area: a semiconductor light emitting device in which a first type electrode is electrically connected to the first electrode and installed within the unit pixel area, a coating layer formed on the semiconductor light emitting device and the barrier layer, and a second electrode electrically connected to the second type electrode of the semiconductor light emitting device on the coating layer.

In addition, the substrate has a rectangular shape defined by the long side and the short side, and the stress separation line may be formed in a direction parallel to the short side direction.

In addition, the stress separation line may be formed continuously in the short side direction.

In addition, a plurality of stress separation lines may be formed in a direction parallel to the short side direction.

In addition, the plurality of stress separation lines may be formed symmetrically with respect to a line crossing the center of the substrate.

In addition, the plurality of stress separation lines may be formed at regular intervals with respect to a line crossing the center of the substrate.

In addition, the stress separation line may include a compensation line having an inclination with respect to the short side direction in the pad area.

In addition, the pad area may include a first area where a connection wire connecting the pixel area and the driving chip is located and a second area outside the driving chip.

In addition, the stress separation line may include a compensation line having an inclination with respect to the short side direction in the first area.

In addition, the stress separation line may include an extension line connected to the compensation line and formed in a direction parallel to the short side direction.

In addition, the stress separation line may separate the transmission of at least one of stress caused by a difference in thermal expansion coefficient between the barrier layer and the substrate and stress generated during thermal curing of the barrier layer.

As a second aspect to achieve the above object, the present invention may include a substrate having a rectangular shape defined by long and short sides and including a pixel area and a pad area located around the pixel area, a barrier layer located on the substrate and defining a plurality of unit pixel areas within the pixel area, a stress separation line located between the unit pixel areas on the barrier layer, and a semiconductor light emitting device installed within the unit pixel area, and the stress separation line may have different slopes in the pixel area and the pad area, and the stress separation line may have different slopes in the pixel area and the pad area.

Advantageous Effects

According to an embodiment of the present invention, the following effects are achieved.

First, according to an embodiment of the present invention, the stress separation line located between the unit pixel areas (assembly holes) of the display device may prevent phenomena caused by stress caused by differences in the thermal expansion coefficients of the barrier layer and the substrate.

In addition, according to an embodiment of the present invention, it is possible to prevent the structure in which the substrate and the barrier layer are formed from bending or the position of the assembly hole formed in the unit pixel area from changing.

In addition, according to one embodiment of the present invention, the compensation line included in the stress separation line may effectively block stress acting in a radial direction from the center of the substrate.

In addition, according to an embodiment of the present invention, the stress separation line including the compensation line may effectively block stress that may occur during thermal curing or cooling of the barrier layer.

Furthermore, according to another embodiment of the present invention, there are additional technical effects not mentioned here. Those skilled in the art may understand the entire contents of the specification and drawings.

DESCRIPTION OF DRAWINGS

FIG. 1 is a conceptual diagram showing an example of a display device using the semiconductor light emitting device of the present invention.

FIG. 2 is a partial enlarged view of part A of FIG. 1.

FIGS. 3A and 3B are cross-sectional views taken along lines B-B and C-C of FIG. 2.

FIG. 4 is a conceptual diagram showing the flip chip type semiconductor light emitting device of FIG. 3.

FIGS. 5A to 5C are conceptual diagrams showing various forms of implementing color in relation to a flip chip type semiconductor light emitting device.

FIG. 6 is a cross-sectional view showing an example of a method of manufacturing a display device using the semiconductor light emitting device of the present invention.

FIG. 7 is a perspective view showing another example of a display device using the semiconductor light emitting device of the present invention.

FIG. 8 is a cross-sectional view taken along line D-D in FIG. 7.

FIG. 9 is a conceptual diagram showing the vertical semiconductor light emitting device of FIG. 8.

FIG. 10 is a plan view showing a display device using a semiconductor light emitting device according to an embodiment of the present invention.

FIG. 11 is a plan schematic diagram showing a stress separation line of a display device using a semiconductor light emitting device according to an embodiment of the present invention.

FIG. 12 is a plan schematic diagram showing an example of a stress separation line of a display device using a semiconductor light emitting device according to an embodiment of the present invention.

FIG. 13 is a plan schematic diagram showing another example of a stress separation line of a display device using a semiconductor light emitting device according to an embodiment of the present invention.

FIG. 14 is a cross-sectional view showing the unit pixel area of a display device using a semiconductor light emitting device according to an embodiment of the present invention.

FIG. 15 is a plan schematic diagram showing stress applied in a display device to which the present invention may be applied.

FIG. 16 is a cross-sectional schematic diagram showing stress generation and resulting phenomena in a display device to which the present invention may be applied.

FIG. 17 is a plan schematic diagram showing the direction of movement of a pattern according to a curing process in a display device to which the present invention may be applied.

FIG. 18 is a photograph showing the phenomenon caused by the movement of the pattern that occurred in each part of FIG. 17.

FIG. 19 is a graph showing the change in thermal expansion coefficient of an organic film, which is a material of a barrier layer that may be applied to an embodiment of the present invention.

FIG. 20 is a cross-sectional schematic diagram showing the barrier layer formation process of a display device using a semiconductor light emitting device according to an embodiment.

FIG. 21 is a schematic diagram showing an actual implementation example of a display device using a semiconductor light emitting device according to an embodiment.

FIG. 22 is a photograph showing area (1) in FIG. 21.
FIG. 23 is a photograph showing area (5) in FIG. 21.
FIG. 24 is a photograph showing area (9) in FIG. 21.

MODE FOR INVENTION

Hereinafter, embodiments disclosed in the present specification will be described in detail with reference to the attached drawings, but identical or similar components will be assigned the same reference numbers regardless of the reference numerals, and duplicate descriptions thereof will be omitted. The suffixes "module" and "part" for components used in the following description are given or used interchangeably only for the ease of preparing the specification, and do not have distinct meanings or roles in themselves. In addition, in describing the embodiments disclosed in this specification, if it is determined that detailed descriptions of related known technologies may obscure the gist of the embodiments disclosed in this specification, the detailed descriptions will be omitted. In addition, it should be noted that the attached drawings are only for easy understanding of the embodiments disclosed in this specification, and should not be construed as limiting the technical idea disclosed in this specification by the attached drawings.

Furthermore, although each drawing is described for convenience of explanation, it is within the scope of the present invention for a person skilled in the art to implement another embodiment by combining at least two or more drawings.

In addition, when an element such as a layer, region, or substrate is referred to as being "on" another component, it will be understood that this may exist directly on another element, or there may be intermediate elements in between.

The display device described in this specification is a concept that includes all display devices that display information as a unit pixel or a set of unit pixels. Therefore, it is not limited to finished products but may also be applied to parts. For example, a panel corresponding to a part of a digital TV also independently corresponds to a display device in this specification. Finished products may include mobile phones, smart phones, laptop computers, digital broadcasting terminals, PDAs (personal digital assistants), PMP (portable multimedia player), navigation, Slate PC, Tablet PC, Ultra Book, digital TV, desktop computer, etc.

However, those skilled in the art will easily understand that the configuration according to the embodiment described in this specification may be applied to a device capable of displaying, even if it is a new product type that is developed in the future.

In addition, the semiconductor light emitting device mentioned in this specification includes LED, micro LED, etc., and may be used interchangeably.

FIG. 1 is a conceptual diagram showing an embodiment of a display device using a semiconductor light emitting device of the present invention.

As shown in FIG. 1, information processed by the control unit (not shown) of the display device 100 may be displayed using a flexible display.

Flexible displays include, for example, displays that may be bent, bent, twisted, folded, or rolled by an external force.

Furthermore, a flexible display may be, for example, a display manufactured on a thin and flexible substrate that may be bent, bent, folded, or rolled like paper while maintaining the display characteristics of a conventional flat display.

In a state where the flexible display is not bent (for example, a state with an infinite radius of curvature, hereinafter referred to as the first state), the display area of the flexible display becomes flat. In this first state, in a state bent by an external force (for example, a state with a finite radius of curvature, hereinafter referred to as the second state), the display area may become a curved surface. As shown in FIG. 1, information displayed in the second state may be visual information output on a curved surface. This visual information is implemented by independently controlling the light emission of unit pixels (sub-pixels) arranged in a matrix form. Here, unit pixel means, for example, the minimum unit for implementing one color.

The unit pixel of this flexible display may be implemented by a semiconductor light emitting device. In the present invention, a light emitting device is exemplified as a type of semiconductor light emitting device that converts current into light. An example of a light emitting device is a light emitting diode (LED). These light emitting diodes are formed in a small size, which allows them to function as a unit pixel even in the second state.

A flexible display implemented using such a light emitting diode will be described in detail with reference to the drawings below.

FIG. 2 is a partial enlarged view of part A of FIG. 1.

FIGS. 3A and 3B are cross-sectional views taken along lines B-B and C-C in FIG. 2.

As shown in FIGS. 2, 3A and 3B, as a display device 100 using a semiconductor light emitting device, a display device 100 using a passive matrix (PM) type semiconductor light emitting device is exemplified. However, the examples described below may also be applied to an active matrix (AM) type semiconductor light emitting device.

As shown in FIG. 2, the display device 100 includes a substrate 110, a first electrode 120, a conductive adhesive layer 130, a second electrode 140, and at least one semiconductor light emitting device 150.

The substrate 110 may be a flexible substrate. For example, in order to implement a flexible display device, the substrate 110 may include glass or polyimide (PI). In addition, any material that has insulating properties and is flexible, such as PEN (Polyethylene Naphthalate) or PET (Polyethylene Terephthalate), may be used. In addition, the substrate 110 may be made of either a transparent or opaque material.

The substrate 110 may be a wiring substrate on which the first electrode 120 is disposed, and therefore the first electrode 120 may be located on the substrate 110.

As shown in FIG. 3A, the insulating layer 160 may be disposed on the substrate 110 where the first electrode 120 is located, and the auxiliary electrode 170 may be located on the insulating layer 160. In this case, the insulating layer 160 stacked on the substrate 110 may become a wiring substrate. More specifically, the insulating layer 160 is made of an insulating and flexible material such as polyimide (PI), PET, or PEN, and may be integrated with the substrate 110 to form one substrate.

The auxiliary electrode 170 is an electrode that electrically connects the first electrode 120 and the semiconductor light emitting device 150, is located on the insulating layer 160 and is disposed to correspond to the position of the first electrode 120. For example, the auxiliary electrode 170 has a dot shape and may be electrically connected to the first electrode 120 through the electrode hole 171 penetrating the insulating layer 160. The electrode hole 171 may be formed by filling the via hole with a conductive material.

As shown in FIG. 2 or FIG. 3A, a conductive adhesive layer 130 is formed on one side of the insulating layer 160, but the present invention is not necessarily limited thereto. For example, a layer performing a specific function is formed between the insulating layer 160 and the conductive adhesive layer 130, or a structure in which the conductive adhesive layer 130 is disposed on the substrate 110 without the insulating layer 160. It is also possible. In a structure in which the conductive adhesive layer 130 is disposed on the substrate 110, the conductive adhesive layer 130 may function as an insulating layer.

The conductive adhesive layer 130 may be a layer having adhesiveness and conductivity. For this purpose, a conductive material and an adhesive material may be mixed in the conductive adhesive layer 130. In addition, the conductive adhesive layer 130 is flexible, thereby enabling a flexible function in the display device.

As an example, the conductive adhesive layer 130 may be an anisotropic conductive film (ACF), an anisotropic conductive paste, or a solution containing conductive particles. The conductive adhesive layer 130 may be configured as a layer that allows electrical interconnection in the Z direction penetrating the thickness, but has electrical insulation in the horizontal X-Y direction. Therefore, the conductive adhesive layer 130 may be called a Z-axis conductive layer (however, hereinafter referred to as a 'conductive adhesive layer').

An anisotropic conductive film is a film in which an anisotropic conductive medium is mixed with an insulating base member, and when heat and/or pressure is applied, only certain parts become conductive due to the anisotropic conductive medium. Hereinafter, it will be explained that heat and/or pressure is applied to the anisotropic conductive film, but other methods may be applied to make the anisotropic conductive film partially conductive. Other methods described above may be, for example, application of either heat or pressure alone, UV curing, etc.

In addition, the anisotropic conductive medium may be, for example, conductive balls or conductive particles. For example, an anisotropic conductive film is a film in which conductive balls are mixed with an insulating base member, and when heat and/or pressure is applied, only specific portions become conductive due to the conductive balls. An anisotropic conductive film may contain a plurality of particles in which the core of a conductive material is covered by an insulating film made of polymer. In this case, the area where heat and pressure are applied becomes conductive due to the core as the insulating film is destroyed. At this time, the shape of the core may be modified to form layers that contact each other in the thickness direction of the film. As a more specific example, heat and pressure are applied entirely to the anisotropic conductive film, and an electrical connection in the Z-axis direction is partially formed due to a height difference between the objects adhered by the anisotropic conductive film.

As another example, an anisotropic conductive film may contain a plurality of particles coated with a conductive material in an insulating core. In this case, the conductive material is deformed (pressed) in the area where heat and pressure are applied and becomes conductive in the direction of the thickness of the film. As another example, it is possible for the conductive material to penetrate the insulating base member in the Z-axis direction and be conductive in the thickness direction of the film. In this case, the conductive material may have a pointed end.

The anisotropic conductive film may be a fixed array anisotropic conductive film (fixed array ACF) in which a conductive ball is inserted into one surface of an insulating base member. More specifically, the insulating base member is made of an adhesive material, the conductive balls are concentrated on the bottom of the insulating base member, when heat or pressure is applied to the base member, it deforms along with the conductive ball and becomes conductive in the vertical direction.

However, the present invention is not necessarily limited to this, anisotropic conductive films may be made in a form in which conductive balls are randomly mixed into an insulating base member, or in a form in which conductive balls are arranged in one layer (double-ACF), which is composed of multiple layers.

Anisotropic conductive paste is a combination of paste and conductive balls, and may be a paste in which conductive balls are mixed with an insulating and adhesive base material. In addition, the solution containing conductive particles may be a solution containing conductive particles or nanoparticles.

Referring again to FIG. 3A, the second electrode 140 is located in the insulating layer 160 and spaced apart from the auxiliary electrode 170. That is, the conductive adhesive layer 130 is disposed on the insulating layer 160 where the auxiliary electrode 170 and the second electrode 140 are located.

After forming the conductive adhesive layer 130 with the auxiliary electrode 170 and the second electrode 140 positioned on the insulating layer 160, when the semiconductor light emitting device 150 is connected in the form of a flip chip by applying heat and pressure, the semiconductor light emitting device 150 is electrically connected to the first electrode 120 and the second electrode 140.

FIG. 4 is a conceptual diagram showing the flip chip type semiconductor light emitting device of FIG. 3.

Referring to FIG. 4, the semiconductor light emitting device may be a flip chip type light emitting device.

For example, a semiconductor light emitting device may include a p-type electrode 156, a p-type semiconductor layer 155 on which the p-type electrode 156 is formed, an active layer 154 formed on the p-type semiconductor layer 155, an n-type semiconductor layer 153 formed on the active layer 154 and an n-type electrode 152 disposed horizontally spaced apart from the p-type electrode 156 on the n-type semiconductor layer 153. In this case, the p-type electrode 156 may be electrically connected to the auxiliary electrode 170 and the conductive adhesive layer 130 shown in FIGS. 3A and 3B, and n-type electrode 152 may be electrically connected to the second electrode 140.

Referring again to FIGS. 2, 3A, and 3B, the auxiliary electrode 170 is formed long in one direction, so that one auxiliary electrode may be electrically connected to a plurality of semiconductor light emitting devices 150. For example, p-type electrodes of semiconductor light emitting devices on the left and right around the auxiliary electrode may be electrically connected to one auxiliary electrode.

More specifically, the semiconductor light emitting device 150 is press-fitted into the conductive adhesive layer 130 by heat and pressure, through this, It is conductive only in the portion between the p-type electrode 156 and the auxiliary electrode 170 of the semiconductor light emitting device 150, and the portion between the n-type electrode 152 and the second electrode 140 of the semiconductor light emitting device 150, the remaining part does not have conductivity because there is no press fit of the semiconductor light emitting device. In this way, the conductive adhesive layer 130 not only bonds the semiconductor light emitting device 150 and the auxiliary electrode 170 and the semiconductor light emitting device 150 and the second electrode 140 to each other, but also forms an electrical connection.

In addition, a plurality of semiconductor light emitting devices 150 constitute a light emitting device array, and a phosphor layer 180 is formed in the light emitting device array.

A light emitting device array may include a plurality of semiconductor light emitting devices having different luminance values. Each semiconductor light emitting device 150 constitutes a unit pixel and is electrically connected to the first electrode 120. For example, there may be a plurality of first electrodes 120, the semiconductor light emitting devices may be arranged in several rows, and the semiconductor light emitting devices in each row may be electrically connected to one of the plurality of first electrodes.

In addition, since semiconductor light emitting devices are connected in the form of a flip chip, semiconductor light emitting devices grown on a transparent dielectric substrate may be used. In addition, the semiconductor light emitting devices may be, for example, nitride semiconductor light emitting devices. Since the semiconductor light emitting device 150 has excellent luminance, individual unit pixels may be formed even in small sizes.

As shown in FIGS. 3A and 3B, a partition wall 190 may be located between the semiconductor light emitting devices 150. In this case, the partition wall 190 may serve to separate individual unit pixels from each other and may be formed integrally with the conductive adhesive layer 130. For example, the base member of the anisotropic conductive film may form a partition wall by inserting the semiconductor light emitting device 150 into the anisotropic conductive film.

In addition, if the base member of the anisotropic conductive film is black, the barrier rib 190 may have reflective characteristics and the contrast may be increased without a separate black insulator.

As another example, a reflective partition may be separately provided as the partition wall 190. In this case, the partition 190 may include a black or white insulator depending on the purpose of the display device. When using a partition made of a white insulator, it may have the effect of increasing reflectivity, and when using a partition made of a black insulator, it may have reflective characteristics and increase contrast at the same time.

The phosphor layer 180 may be located on the outer surface of the semiconductor light emitting device 150. For example, the semiconductor light emitting device 150 is a blue semiconductor light emitting device that emits blue (B) light, and the phosphor layer 180 performs the function of converting the blue (B) light into the color of a unit pixel. The phosphor layer 180 may be a red phosphor 181 or a green phosphor 182 constituting an individual pixel.

That is, at a position forming a red unit pixel, a red phosphor 181 capable of converting blue light into red (R) light may be stacked on the blue semiconductor light emitting device, at a position forming a green unit pixel, a green phosphor 182 capable of converting blue light into green (G) light may be stacked on a blue semiconductor light emitting device. In addition, only a blue semiconductor light emitting device may be used in the part that forms the blue unit pixel. In this case, red (R), green (G), and blue (B) unit pixels may form one pixel. More specifically, phosphors of one color may be stacked along each line of the first electrode 120. Accordingly, one line in the first electrode 120 may be an electrode that controls one color. That is, red (R), green (G), and blue (B) may be arranged in order along the second electrode 140, and through this, a unit pixel may be implemented.

However, the present invention is not necessarily limited to this, instead of a phosphor, a semiconductor light emitting device 150 and quantum dots (QDs) may be combined to implement unit pixels of red (R), green (G), and blue (B).

In addition, a black matrix 191 may be disposed between each phosphor layer to improve contrast. In other words, this black matrix 191 may improve contrast between light and dark.

However, the present invention is not necessarily limited to this, and other structures for implementing blue, red, and green colors may be applied.

FIGS. 5A to 5C are conceptual diagrams showing various forms of implementing color in relation to a flip chip type semiconductor light emitting device.

Referring to FIG. 5A, each semiconductor light emitting device 150 may be implemented as a high-output light-emitting device that uses gallium nitride (GaN) as a main material and adds indium (In) and/or aluminum (Al) to emit various lights, including blue.

In this case, the semiconductor light emitting device 150 may be a red (R), green (G), and blue (B) semiconductor light emitting device to form a unit pixel (sub-pixel). For example, red, green, and blue semiconductor light emitting devices (R, G, B) are arranged alternately, By using a red, green, and blue semiconductor light emitting device, unit pixels of red, green, and blue form one pixel, and through this, a full color display may be implemented.

Referring to FIG. 5B, the semiconductor light emitting device 150a may include a white light emitting device (W) in which a yellow phosphor layer is provided for each individual device. In this case, a red phosphor layer 181, a green phosphor layer 182, and a blue phosphor layer 183 may be provided on the white light emitting device (W) to form a unit pixel. In addition, a unit pixel may be formed on the white light emitting device (W) using a color filter that repeats red, green, and blue.

Referring to FIG. 5C, the semiconductor light emitting device 150b may have a structure in which a red phosphor layer 184, a green phosphor layer 185, and a blue phosphor layer 186 are provided on an ultraviolet light emitting device (UV). In this way, the semiconductor light emitting device may be used in all areas, not only visible light but also ultraviolet (UV) light, and may be expanded to the form of a semiconductor light emitting device in which ultraviolet light (UV) may be used as an excitation source for the upper phosphor.

Looking again at this example, the semiconductor light emitting device is located on the conductive adhesive layer, forming a unit pixel in the display device. Because semiconductor light emitting devices have excellent luminance, individual unit pixels may be formed even in small sizes.

The size of such individual semiconductor light emitting devices (150, 150a, 150b), for example, may be 80 μm or less in length on one side, and may be a rectangular or square device. In the case of a rectangular shape, the size may be less than 20×80 μm.

In addition, even if a square semiconductor light emitting device (150, 150a, 150b) with a side length of 10 μm is used as a unit pixel, sufficient brightness to form a display device appears.

Therefore, for example, in the case where the size of the unit pixel is a rectangular pixel with one side of 600 μm and the other side of 300 μm, the distance between the semiconductor light emitting devices (150, 150a, 150b) becomes relatively large enough.

Therefore, in this case, it is possible to implement a flexible display device with high definition quality, HD quality or higher.

A display device using the semiconductor light emitting device described above may be manufactured using a new type of manufacturing method. Hereinafter, the manufacturing method will be described with reference to FIG. 6.

FIG. 6 is a cross-sectional view showing an example of a method of manufacturing a display device using the semiconductor light emitting device of the present invention.

As shown in FIG. 6, first, a conductive adhesive layer 130 is formed on the insulating layer 160 where the auxiliary electrode 170 and the second electrode 140 are located. The insulating layer 160 is stacked on the first substrate 110 to form one substrate (or wiring substrate), a first electrode 120, an auxiliary electrode 170, and a second electrode 140 are disposed on the wiring substrate. In this case, the first electrode 120 and the second electrode 140 may be arranged in directions orthogonal to each other. In addition, in order to implement a flexible display device, the first substrate 110 and the insulating layer 160 may each include glass or polyimide (PI).

For example, the conductive adhesive layer 130 may be implemented by an anisotropic conductive film, and for this purpose, the anisotropic conductive film may be applied to the substrate on which the insulating layer 160 is located.

Next, a second substrate 112 on which a plurality of semiconductor light emitting devices 150 constituting individual pixels are located, corresponding to the positions of the auxiliary electrode 170 and the second electrode 140 is arranged so that the semiconductor light emitting device 150 faces the auxiliary electrode 170 and the second electrode 140.

In this case, the second substrate 112 is a growth substrate for growing the semiconductor light emitting device 150, and may be a sapphire substrate or a silicon substrate.

The semiconductor light emitting device may be effectively used in a display device by having a gap and size that may form a display device when formed in a wafer unit.

Next, the wiring substrate and the second substrate 112 are heat-compressed. For example, the wiring substrate and the second substrate 112 may be heat-compressed using an ACF press head. The wiring substrate and the second substrate 112 are bonded by heat compression. Due to the characteristics of the anisotropic conductive film that becomes conductive by heat compression, only the portion between the semiconductor light emitting device 150 and the auxiliary electrode 170 and the second electrode 140 becomes conductive, through this, the electrodes and the semiconductor light emitting device 150 may be electrically connected. At this time, the semiconductor light emitting device 150 is inserted into the anisotropic conductive film, and a partition wall may be formed between the semiconductor light emitting devices 150 through this.

Then, the second substrate (112) is removed. For example, the second substrate 112 may be removed using a laser lift-off (LLO) method or a chemical lift-off (CLO) method.

Finally, the second substrate 112 is removed to expose the semiconductor light emitting devices 150 to the outside. If necessary, a transparent insulating layer (not shown) may be formed by coating the wiring substrate to which the semiconductor light emitting device 150 is connected with silicon oxide (SiOx).

In addition, the step of forming a phosphor layer on one side of the semiconductor light emitting device 150 may be further included. For example, the semiconductor light emitting device 150 is a blue semiconductor light emitting device that emits blue (B) light, red phosphor or green phosphor to convert this blue (B) light into the color of a unit pixel may form a layer on one side of the blue semiconductor light emitting device.

The manufacturing method or structure of the display device using the semiconductor light emitting device described above may be modified into various forms. As an example, a vertical semiconductor light emitting device may also be applied to the display device described above.

In addition, in the modified examples or embodiments described below, the same or similar reference numbers are assigned to the same or similar components as the previous example, and the description is replaced with the first description.

FIG. 7 is a perspective view showing another embodiment of a display device using the semiconductor light emitting device of the invention, FIG. 8 is a cross-sectional view taken along line D-D of FIG. 7, and FIG. 9 is a conceptual diagram showing the vertical semiconductor light emitting device of FIG. 8.

Referring to these drawings, the display device may be a display device using a passive matrix (PM) type vertical semiconductor light emitting device.

This display device includes a substrate 210, a first electrode 220, a conductive adhesive layer 230, a second electrode 240, and at least one semiconductor light emitting device 250.

The substrate 210 is a wiring substrate on which the first electrode 220 is disposed, and may include polyimide (PI) to implement a flexible display device. In addition, any material that is insulating and flexible may be used.

The first electrode 220 is located on the substrate 210 and may be formed as a long bar-shaped electrode in one direction. The first electrode 220 may be configured to function as a data electrode.

The conductive adhesive layer 230 is formed on the substrate 210 where the first electrode 220 is located. Like a display device with a flip chip type light emitting element, the conductive adhesive layer 230 may be an anisotropic conductive film (ACF), an anisotropic conductive paste, or a solution containing conductive particles. However, this embodiment also illustrates a case where the conductive adhesive layer 230 is implemented by an anisotropic conductive film.

After positioning the anisotropic conductive film with the first electrode 220 positioned on the substrate 210, when the semiconductor light emitting device 250 is connected by applying heat and pressure, the semiconductor light emitting device 250 is electrically connected to the first electrode 220. At this time, the semiconductor light emitting device 250 is preferably placed on the first electrode 220.

As described above, this kind of electrical connection is created because the anisotropic conductive film becomes partially conductive in the thickness direction when heat and pressure are applied. Therefore, the anisotropic conductive film is divided into a conductive part and a non-conductive part in the thickness direction.

In addition, because the anisotropic conductive film contains an adhesive component, the conductive adhesive layer 230 implements not only electrical connection but also mechanical connection between the semiconductor light emitting device 250 and the first electrode 220.

In this way, the semiconductor light emitting device 250 is located on the conductive adhesive layer 230, and constitutes individual pixels in the display device through this. Since the semiconductor light emitting device 250 has excellent luminance, it is possible to configure individual unit pixels even in small sizes. The size of such an individual semiconductor light emitting device 250 may be, for example, a side length of 80 μm or less, and may be a rectangular or square device. In the case of a rectangle, for example, the size may be 20×80 μm or less.

This semiconductor light emitting device 250 may have a vertical structure.

Between the vertical semiconductor light emitting devices, a plurality of second electrodes 240 are disposed in a direction crossing the longitudinal direction of the first electrode 220 and are electrically connected to the vertical semiconductor light emitting device (250).

Referring to FIG. 9, this vertical semiconductor light emitting device includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom may be electrically connected to the first electrode 220 and the conductive adhesive layer 230, the n-type electrode 252 located at the top may be electrically connected to the second electrode 240, which will be described later. This vertical semiconductor light emitting device 250 has the great advantage of being able to reduce the chip size because electrodes may be arranged up and down.

Referring again to FIG. 8, a phosphor layer 280 may be formed on one surface of the semiconductor light emitting device 250. For example, the semiconductor light emitting device 250 is a blue semiconductor light emitting device 251 that emits blue (B) light, a phosphor layer 280 may be provided to convert this blue (B) light into the color of a unit pixel. In this case, the phosphor layer 280 may be a red phosphor 281 and a green phosphor 282 constituting individual pixels.

That is, at a position forming a red unit pixel, a red phosphor 281 capable of converting blue light into red (R) light may be stacked on the blue semiconductor light emitting device, at a position forming a green unit pixel, a green phosphor 282 capable of converting blue light into green (G) light may be stacked on a blue semiconductor light emitting device. In addition, only a blue semiconductor light emitting device may be used in the part that forms the blue unit pixel. In this case, red (R), green (G), and blue (B) unit pixels may form one pixel.

However, the present invention is not necessarily limited to this, and as described above in a display device using a flip chip type light emitting device, other structures for implementing blue, red, and green colors may be applied.

Looking at this embodiment again, the second electrode 240 is located between the semiconductor light emitting devices 250 and is electrically connected to the semiconductor light emitting devices 250. For example, the semiconductor light emitting devices 250 may be arranged in a plurality of rows, and the second electrode 240 may be located between the rows of the semiconductor light emitting devices 250.

Since the distance between the semiconductor light emitting devices 250 forming individual pixels is sufficiently large, the second electrode 240 may be located between the semiconductor light emitting devices 250.

The second electrode 240 may be formed as a long bar-shaped electrode in one direction and may be arranged in a direction perpendicular to the first electrode.

In addition, the second electrode 240 and the semiconductor light emitting device 250 may be electrically connected by a connection electrode protruding from the second electrode 240. More specifically, the connection electrode may be an n-type electrode of the semiconductor light emitting device 250. For example, the n-type electrode is formed as an ohmic electrode for ohmic contact, and the second electrode 240 covers at least a portion of the ohmic electrode by printing or deposition. Through this, the second electrode 240 and the n-type electrode of the semiconductor light emitting device 250 may be electrically connected.

Referring again to FIG. 8, the second electrode 240 may be positioned on the conductive adhesive layer 230. In some cases, a transparent insulating layer (not shown) containing silicon oxide (SiOx) or the like may be formed on the substrate 210 on which the semiconductor light emitting device 250 is formed. When the second electrode 240 is placed after the transparent insulating layer is formed, the second electrode 240 is located on the transparent insulating layer. In addition, the second electrode 240 may be formed to be spaced apart from the conductive adhesive layer 230 or the transparent insulating layer.

If a transparent electrode such as ITO (Indium Tin Oxide) is used to position the second electrode 240 on the semiconductor light emitting device 250, ITO material has a problem of poor adhesion to the n-type semiconductor layer. Therefore, the present invention has the advantage of not having to use a transparent electrode such as ITO by placing the second electrode 240 between the semiconductor light emitting devices 250. Therefore, light extraction efficiency may be improved by using a conductive material with good adhesion to the n-type semiconductor layer as a horizontal electrode without being restricted by the selection of a transparent material.

Referring again to FIG. 8, a partition wall 290 may be located between the semiconductor light emitting device 250. That is, a partition 290 may be disposed between the vertical semiconductor light emitting devices 250 to isolate the semiconductor light emitting devices 250 forming individual pixels. In this case, the partition wall 290 may serve to separate individual unit pixels from each other and may be formed integrally with the conductive adhesive layer 230. For example, the base member of the anisotropic conductive film may form the partition wall 290 by inserting the semiconductor light emitting device 250 into the anisotropic conductive film.

In addition, if the base member of the anisotropic conductive film is black, the partition 290 may have reflective characteristics and the contrast may be increased even without a separate black insulator.

As another example, as the partition 290, a reflective partition may be provided separately. The partition 290 may include a black or white insulator depending on the purpose of the display device.

If the second electrode 240 is located directly on the conductive adhesive layer 230 between the semiconductor light emitting devices 250, the partition wall 290 may be positioned between the vertical semiconductor light emitting device 250 and the second electrode 240. Therefore, individual unit pixels may be formed even in small sizes using the semiconductor light emitting device 250, the distance between the semiconductor light emitting devices 250 is relatively large enough so that the second electrode 240 may be positioned between the semiconductor light emitting devices 250, and a flexible display device with HD image quality may be implemented.

In addition, as shown in FIG. 8, a black matrix 291 may be disposed between each phosphor to improve contrast. In other words, this black matrix 291 may improve contrast between light and dark.

In the display device using the semiconductor light emitting device of the present invention described above, the semiconductor light emitting device is a flip chip type and is placed on a wiring substrate and used as an individual pixel.

FIG. 10 is a plan view showing a display device using a semiconductor light emitting device according to an embodiment of the present invention. FIG. 11 is a plan schematic diagram showing a stress separation line of a display device using a semiconductor light emitting device according to an embodiment of the present invention.

Referring to FIGS. 10 and 11, the display device 300 may include a pixel area 301 and a pad area around the pixel area. These pixel areas 301 and pad areas may be set on the substrate 310.

For example, the display device 300 shown in FIGS. 10 and 11 may be part of the entire display device. For example, the display device 300 shown in FIGS. 10 and 11 may be one module of a display device in which multiple modules are combined to form an entire display device.

A plurality of unit pixel areas may be located within the pixel area 301. In the pad area located around the pixel area 301, a pad 410 located on the edge of the pixel area 301, a driving chip 400, and a connection wire 420 connecting the pad 410 and the driving chip 400 may be located.

The substrate 310 may have a rectangular shape defined by a long side and a short side. Referring to FIG. 10, the long side (H) may be in the height direction and the short side (W) may be in the width direction. At this time, the driving chip 400 may be located at a certain distance from the edge of the pixel area 301 along the long side (H) direction. That is, the driving chip 400 may be positioned parallel to the long side (H) direction.

The length of the driving chip 400 may be smaller than the length (long side: H) of the pixel area 301. Accordingly, the connection wire 420 connecting the pad 410 and the driving chip 400 may be positioned at an angle with respect to the short side (W).

A barrier layer 360 (refer to FIGS. 13 and 14) that defines a plurality of unit pixel regions within the pixel region 301 may be located on the substrate 310. That is, the barrier layer 360 may define a plurality of unit pixel areas (assembly holes; formed at locations where the semiconductor light emitting device is assembled), and these unit pixel areas may be located within the pixel area 301.

Unit pixel areas (assembly holes) may be located at regular intervals in the pixel area 301 (see FIGS. 13 and 14). Accordingly, a plurality of unit pixel areas located within the pixel area 301 may be formed as a number of lines along the long side (H) direction on the substrate 310. In addition, these plural unit pixel areas may form multiple lines along the short side (W) direction. At this time, a plurality of unit pixel areas formed along each line may be located at regular intervals.

A stress separation line 390 located between unit pixel areas may be formed on the barrier layer 360. This stress separation line 390 may be located between each pixel. In addition, pixel lines may be located at regular intervals among multiple pixel lines. For example, one stress separation line 390 may be located for every two pixel lines. However, the present invention is not limited thereto. In this way, the stress separation line 390 may be formed in a direction crossing the pixel line. The relationship between this stress separation line 390 and the pixel will be described later with reference to the drawings.

Hereinafter, the stress separation line 390 will be described in detail.

As mentioned above, the substrate 310 has a rectangular shape defined by the long side (H) and the short side (W), and the stress separation line 390 may be formed in a direction parallel to the short side direction (W).

In addition, the stress separation line 390 may be formed continuously with respect to the short side direction (W). That is, the stress separation line 390 may be formed across the entire width (W) of the substrate 310.

A plurality of stress separation lines 390 may be formed in a direction parallel to the short side direction (W). Referring to FIGS. 10 and 11, an embodiment in which the stress separation line 390 is formed at two locations on the upper side and two locations on the lower side centered on a center line (C) crossing the substrate is shown.

These multiple stress separation lines 390 may be formed symmetrically with respect to a line (center line: C) crossing the center of the substrate 310. Referring to FIGS. 10 and 11, it may be seen that the stress separation lines 390 formed at two locations on the upper side and two locations on the lower side of the center line (C) crossing the substrate are symmetrical to each other with respect to the center line (C).

In addition, a plurality of these stress separation lines 390 may be formed at regular intervals with respect to the center line C crossing the center of the substrate 310. For example, among the stress separation lines 390 formed at two locations on the upper side and two locations on the lower side centered on the center line (C) crossing the substrate, the two stress separation lines 390 on the upper side and two stress separation lines 390 on the lower side may be formed at regular intervals.

Referring to FIGS. 10 and 11, the stress separation line 390 may include a compensation line 392 having an inclination with respect to the short side direction (W) in the pad area.

The pad area may include a first area (c) where the connection wire 420 connecting the pixel area 301 and the driving chip 400 is located, and a second area (a) outside the driving chip 400. In FIG. 11, the pixel area 301 is indicated as "b" with respect to the short side (W) direction.

The compensation line 392 described above may be located in the first area (c) where the connection wire 420 is located.

The slope of the compensation line 392 may be set so that the compensation line 392 intersects the radial direction from the center of the substrate 310.

For example, the slope of the compensation line 392 may be set perpendicular to the radial direction from the center of the substrate 310.

Therefore, the stress separation line 390 including the compensation line 392 may effectively block stress that may occur during thermal curing or cooling of the barrier layer 360.

The stress separation line 390 may include a first line 391 located in the pixel area 3010. In addition, the stress separation line 390 may include an extension line 393 connected to the compensation line 392 and formed in a direction parallel to the short side (W) direction.

Such a stress separation line 390 may separate the transfer of stress due to a difference in thermal expansion coefficient between the barrier layer 360 and the substrate 310. This will be described in detail below with reference to the drawings.

FIG. 12 is a plan schematic diagram showing an example of a stress separation line of a display device using a semiconductor light emitting device according to an embodiment of the present invention. FIG. 13 is a plan schematic diagram showing another example of a stress separation line of a display device using a semiconductor light emitting device according to an embodiment of the present invention.

As mentioned above, a stress separation line 390 located between unit pixel areas may be formed on the barrier layer 360. This stress separation line 390 may be located between each pixel.

Referring to FIG. 12, unit pixel areas defined by a pair of first electrodes 320 may be located at regular intervals, and a stress separation line 390 may be formed between these unit pixel areas.

This stress separation line 390 may be located at the center of an adjacent unit pixel area. That is, the stress separation line 390 may be located at the center of the neighboring first electrode 320 pair.

Referring to FIG. 12, the stress separation line 390 may be formed in a form in which the barrier layer 360 is disconnected. Expressed differently, the stress separation line 390 may be formed in the form of a groove located on the barrier layer 360 to completely separate the barrier layers 360 from each other.

When the barrier layer 360 is formed on the substrate 310, due to the stress generated by the difference in the thermal expansion coefficient of the barrier layer 360 and the substrate 310, the structure formed by the substrate 310 and the barrier layer 360 is bent or the position of the assembly hole formed in the unit pixel area is changed.

However, the stress separation line 390 located between the unit pixel area defined by this pair of first electrodes 320 may prevent a phenomenon that occurs due to stress caused by a difference in thermal expansion coefficient between the barrier layer 360 and the substrate 310. For example, the stress separation line 390 may prevent the structure in which the substrate 310 and the barrier layer 360 are formed from bending or the position of the assembly hole formed in the unit pixel area from changing.

At this time, the compensation line 392 included in the stress separation line 390 may effectively block stress acting in a radial direction from the center of the substrate 310.

In this way, the stress separation line 390 including the compensation line 392 may effectively block stress that may occur during thermal curing or cooling of the barrier layer 360.

Referring to FIG. 13, the stress separation line 390 may be formed in a form in which the barrier layer 360 is partially disconnected. Expressed differently, the stress separation line 390 may be formed in the form of a groove located on the barrier layer 360 to partially separate the barrier layers 360 from each other. That is, the stress separation line 390 may have a groove formed at a portion of the thickness of the barrier layer 360.

FIGS. 12 and 13 show an embodiment in which stress separation lines 390 are located between adjacent unit pixel areas, but the present invention is not limited to this embodiment. That is, the stress separation line 390 may be formed between adjacent unit pixel areas at regular intervals.

FIG. 14 is a cross-sectional view showing the unit pixel area of a display device using a semiconductor light emitting device according to an embodiment of the present invention.

Referring to FIG. 14, the first electrode 320 may be located in the unit pixel area, a semiconductor light emitting device 350 in which a first type electrode (for example, an n-type electrode) is electrically connected to the first electrode 320 may be installed. This first electrode 320 may be formed in pairs with the assembly electrode 340. At least one of the first electrode 320 and the assembly electrode 340 may be covered with a coating layer 330.

A coating layer 370 may be located on the semiconductor light emitting device 350 and the barrier layer 360, a second electrode 380 electrically connected to a second type electrode (for example, a p-type electrode) of the semiconductor light emitting device 350 may be located on the coating layer 370.

Meanwhile, the above describes an example in which the stress separation line 390 is formed in the barrier layer 360. The stress separation line 390 may be formed in any layer located on the substrate 310 and having different thermal expansion coefficients. That is, for example, the stress separation line 390 may be formed in at least one of the covering layer 330, the barrier layer 360, and the coating layer 370 formed on the substrate 310.

FIG. 15 is a plan schematic diagram showing stress applied in a display device to which the present invention may be applied. FIG. 16 is a cross-sectional schematic diagram showing stress generation and resulting phenomena in a display device to which the present invention may be applied.

Referring to FIG. 15, the display device may generate stress in the direction indicated by the arrow depending on its position. As explained above, this stress may occur due to differences in the thermal expansion coefficients of the barrier layer and the substrate. For example, when a barrier layer is formed on a substrate, thermal expansion occurs, and when it is cooled, this thermal expansion contracts, causing stress between the substrate and the barrier layer. As another example, stress may occur during heat curing after forming a barrier layer with an organic film.

Since the thermal expansion of the barrier layer 360 is greater than that of the substrate 310, which is generally made of glass, etc., stress may occur between the substrate 310 and the barrier layer 360. The direction of this stress has a direction indicated by a thick arrow in individual modules, and has a direction indicated by a thin arrow pointing toward the center of the display device as a whole.

Referring to FIG. 16 (A), in a state where the electrode 32 and the barrier layer 36 are formed on the substrate 31 on the jig or lower cover 50, a mounting space (pattern) may be formed through an exposure process through the slit 40 at a location where the light emitting device is to be mounted.

Afterwards, referring to FIG. 16(B), a curing process of the barrier layer 36 may be performed. This curing process may usually include a thermal or ultraviolet curing process. Since this process is a high temperature process, the barrier layer 36 may expand. Accordingly, the mounting space (pattern) formed at the location where the light emitting device is to be mounted may be moved.

Therefore, depending on the location of the display device, a phenomenon may occur where the pattern indicating the mounting position (assembly hole pattern) formed on the barrier layer 36 and the unit pixel area defined by the actual electrode 32 are misaligned. That is, a discrepancy may occur between the pattern of the unit pixel area defined by the electrode 32 and the pixel area formed on the barrier layer 36.

In this way, in the panel process of a display device, when forming a barrier layer after forming a metal wiring electrode for mounting a light emitting device (chip transfer), patterning errors in the wiring (first electrode) and assembly holes may occur at the outer location due to substrate bending.

The degree of this patterning error may increase as it moves further to the outskirts compared to the central area of the display device. In other words, the degree of error may increase in the radial direction from the center of the substrate. In other words, the effect of stress may increase in a radial direction from the center of the substrate.

FIG. 17 is a plan schematic diagram showing the direction of movement of a pattern according to a curing process in a display device to which the present invention may be applied. FIG. 18 is a photograph showing the phenomenon caused by the movement of the pattern that occurred in each part of FIG. 17.

A display device may be divided into multiple areas (Groups). These multiple areas may correspond to one module of a modular display as mentioned above.

FIG. 17 shows a display device divided into a total of 25 areas. At this time, the position of the pattern may not change in the location of Group 13 area ① located in the center. That is, there may be no mismatch between the pattern of the unit pixel area defined by the electrode 32 and the pixel area formed on the barrier layer 36.

However, the degree to which the pattern moves may increase as you move away from the center. For example, the degree to which the pattern moves may be intensified at the position ② close to Group 1, the position ③ close to Group 5, the position ④ close to Group 21, and the position ⑤ close to Group 25 on the display device.

FIG. 18 shows a photograph in which this pattern movement occurred. FIG. 18 (A) shows a photo at position ②, (B) shows a photo at position ①, (C) represents a photograph at position ③, (D) represents a photograph at position ④, and (E) represents a photograph at position 5.

Referring to FIG. 18, in (B), a photo taken at position ①, it may be seen that the pattern and unit pixel area match. However, in (A), (C), (D), and (E), it may be seen that the pattern and unit pixel area do not match each other. This mismatch phenomenon may be a phenomenon caused by pattern movement of the barrier layer 36 due to the curing process, as described above. In other words, this may be a phenomenon caused by a difference in thermal expansion coefficient between the substrate 31 and the barrier layer 36.

This discrepancy between the pattern and the unit pixel area may be caused by the use of multiple masks due to various alignment processes performed during the manufacturing process of the display device, and as a result, the degree of pattern discrepancy may become more severe. In other words, errors due to alignment tolerances for each process may accumulate. Therefore, it is advantageous to prevent this pattern movement phenomenon when manufacturing a display device.

FIG. 19 is a graph showing the change in thermal expansion coefficient of an organic film, which is a material of a barrier layer that may be applied to an embodiment of the present invention.

The coating layer of the display device 300, including barrier layer 360, may be formed using an organic film. This organic film is first formed on the substrate 310, then goes through a patterning process, and may then be cured by heat or ultraviolet rays.

Referring to FIG. 19, the degree of expansion according to the temperature of the organic film is shown. In addition, it may be seen that the coefficient of thermal expansion (CTE) of the organic film changes at the glass transition temperature (vitrification temperature (Tg)).

In other words, when heat is applied to the organic film, it may be seen that the organic film hardens like a glass film above the vitrification temperature (Tg). At this time, the thermal expansion coefficient changes at the vitrification temperature (Tg).

Therefore, after forming the barrier layer 360 with an organic film, a pattern is formed in the unit pixel areas at positions where the light emitting device will be mounted. Afterwards, it goes through a thermal curing process, and as the thermal expansion coefficient changes, stress is generated and the pattern may move as described above.

However, the stress separation line 390 as described above may block the stress caused by the change in thermal expansion coefficient or the difference in thermal expansion coefficient with the substrate 310. Therefore, the pattern formed at the location where the light emitting device is to be mounted may be formed at the exact location without moving during the heat curing or cooling process.

FIG. 20 is a cross-sectional schematic diagram showing the barrier layer formation process of a display device using a semiconductor light emitting device according to an embodiment.

First, referring to FIG. 20(A), a barrier layer 360 may be formed on the substrate 310 using an organic film.

Next, referring to FIG. 20(B), a stress separation line 390 may be formed on the barrier layer 360 formed on the substrate 310.

At this time, although not separately shown, a pattern for mounting a light emitting device may be formed on the barrier layer 360. This pattern and stress separation line 390 may be formed simultaneously. During this process, the substrate 310 and barrier layer 360 may be overall bent.

Thereafter, referring to FIG. 20(C), after curing the barrier layer 360, the substrate 310 and the barrier layer 360 may be restored to a flat state. In this process, the stress may be separated or distributed in the process of hardening the barrier layer 360 by the stress separation line 390. Accordingly, stress may not apply to the position of the pattern where the light emitting device is to be mounted.

In addition, as described above, the direction of stress generated during the panel process has a direction indicated by a thick arrow in individual modules, and has a direction indicated by a thin arrow pointing toward the center of the display device as a whole.

Accordingly, the stress separation line 390 including the compensation line 392 may effectively block stress acting in a radial direction from the center of the substrate 310.

In this way, the stress separation line 390 including the compensation line 392 may effectively block stress that may occur during thermal curing or cooling of the barrier layer 360.

FIG. 21 is a schematic diagram showing an actual implementation example of a display device using a semiconductor light emitting device according to an embodiment. FIG. 22 is a photograph showing area (1) in FIG. 21. FIG. 23 is a photograph showing area (5) in FIG. 21. FIG. 24 is a photograph showing area (9) in FIG. 21.

Referring to FIG. 21, pixel areas are indicated as numbers 1 to 9. The remaining areas represent at least a portion of the pad area described above.

An example of the implementation of such a display device shows a case where the pixel area of the display device is divided into 9 areas. These nine areas may be composed of nine unit modules.

Although not shown in FIG. 21, the state of each area when the stress separation line 390 described above is formed is shown in FIGS. 22 to 24.

Referring to FIGS. 22 to 24, unlike the case of FIG. 18 shown above, it may be seen that in all areas including area ①, area ⑤, and area ⑨, each unit pixel area is not biased to one side and is formed at the correct position.

In this way, the stress separation line located between the unit pixel area (assembly hole) of the display device may prevent a phenomenon that occurs due to stress caused by a difference in thermal expansion coefficient between the barrier layer 360 and the substrate 310.

For example, the stress separation line 390 may prevent the structure in which the substrate 310 and the barrier layer 360 are formed from bending or the position of the assembly hole formed in the unit pixel area from changing.

At this time, the compensation line 392 included in the stress separation line 390 may effectively block stress acting in a radial direction from the center of the substrate 310.

In this way, the stress separation line 390 including the compensation line 392 may effectively block stress that may occur during thermal curing or cooling of the barrier layer 360.

The above description is merely an illustrative explanation of the technical idea of the present invention, those skilled in the art will be able to make various modifications and variations without departing from the essential characteristics of the present invention.

Accordingly, the embodiments disclosed in the present invention are not intended to limit the technical idea of the present invention, but are for illustrative purposes, and the scope of the technical idea of the present invention is not limited by these embodiments.

The scope of protection of the present invention shall be interpreted in accordance with the claims below, and all technical ideas within the equivalent scope shall be construed as being included in the scope of rights of the present invention.

INDUSTRIAL APPLICABILITY

According to the present invention, a display device using a semiconductor light emitting device such as micro LED and a method of manufacturing the same may be provided.

The invention claimed is:

1. A display device using a semiconductor light emitting device comprising:
a substrate comprising a pixel area and a pad area located around the pixel area;
a barrier layer positioned on the substrate and configured to define a plurality of unit pixel areas within the pixel area;
a stress separation line located between the unit pixel areas on the barrier layer;
a first electrode located in the unit pixel area;
a semiconductor light emitting device in which a first type electrode is electrically connected to the first electrode within the unit pixel area;
a coating layer formed on the semiconductor light emitting device and the barrier layer, and
a second electrode electrically connected to a second type electrode of the semiconductor light emitting device on the coating layer,
wherein the stress separation line comprises a compensation line having an inclination with respect to a short side direction of the substrate in the pad area,
wherein the inclination of the compensation line is set so that the compensation line intersects a radial direction from a center of the substrate,
wherein the stress separation line comprises a plurality of parallel stress separation lines in a top view of the substrate,
wherein a width of a portion of the stress separation line is greater than a width of the semiconductor light emitting device, and
wherein the plurality of parallel stress separation lines and the compensation line are arranged symmetrically with respect to a line crossing the center of the substrate in the top view of the substrate.

2. The display device using the semiconductor light emitting device according to claim 1, wherein the substrate has a rectangular shape defined by a long side and, a short side,
wherein the stress separation line is arranged in a direction parallel to the short side direction.

3. The display device using the semiconductor light emitting device according to claim 2, wherein the stress separation line is continuously arranged with respect to the short side direction.

4. The display device using the semiconductor light emitting device according to claim 1, wherein the plurality of stress separation lines are arranged at regular intervals with respect to a line crossing the center of the substrate.

5. The display device using the semiconductor light emitting device according to claim 1, wherein the pad area comprises a first area where a connection wire connecting the pixel area and the driving chip is located, and a second area outside the driving chip.

6. The display device using the semiconductor light emitting device according to claim 1, wherein the stress separation line is connected to the compensation line and comprises an extension line disposed in a direction parallel to the short side direction.

7. The display device using the semiconductor light emitting device according to claim 1, wherein the stress separation line is configured to separate the transmission of at least one of stress caused by a difference in thermal expansion coefficient between the barrier layer and the substrate and stress generated during thermal curing of the barrier layer.

8. The display device using the semiconductor light emitting device according to claim 6, wherein the extension line of the stress separation line parallel to the short side direction is not vertically overlapped with the first electrode and the second electrode on the substrate.

9. A display device using a semiconductor light emitting device comprising:
a substrate having a rectangular shape defined by a long side direction and a short side direction and comprising a pixel area and a pad area located around the pixel area;
a barrier layer positioned on the substrate and configured to define a plurality of unit pixel areas within the pixel area;
a stress separation line located between the unit pixel areas on the barrier layer; and
a semiconductor light emitting device installed in the unit pixel area,
wherein the stress separation line is configured to have different slopes in the pixel area and the pad area,
wherein the stress separation line comprises a compensation line having an inclination with respect to the short side direction of the substrate in the pad area, and
wherein the inclination of the compensation line is set so that the compensation line intersects a radial direction from a center of the substrate, wherein the stress separation line comprises a plurality of parallel stress separation lines in a top view of the substrate, wherein a width of a portion of the stress separation line is greater than a width of the semiconductor light emitting device, and wherein the plurality of parallel stress separation lines and the compensation line are arranged symmetrically with respect to a line crossing the center of the substrate in the top view of the substrate.

10. The display device using the semiconductor light emitting device according to claim 9, wherein the stress separation line is continuously arranged with respect to the short side direction.

11. The display device using the semiconductor light emitting device according to claim 9, wherein the plurality of stress separation lines are arranged at regular intervals with respect to a line crossing the center of the substrate.

12. The display device using the semiconductor light emitting device according to claim 9, wherein the pad area comprises a first area where a connection wire connecting the pixel area and the driving chip is located, and a second area outside the driving chip.

13. The display device using the semiconductor light emitting device according to claim 9, wherein the stress separation line is connected to the compensation line and comprises an extension line formed in a direction parallel to the short side direction.

14. The display device using the semiconductor light emitting device according to claim 9, wherein the stress separation line is configured to separate the transmission of at least one of stress caused by a difference in thermal expansion coefficient between the barrier layer and the substrate and stress generated during thermal curing of the barrier layer.

15. The display device using the semiconductor light emitting device according to claim 13, wherein the extension line of the stress separation line parallel to the short side direction is not vertically overlapped with an electrode electrically connected the semiconductor light emitting device on the substrate.

* * * * *